United States Patent
Yoon et al.

(10) Patent No.: US 8,576,622 B2
(45) Date of Patent: Nov. 5, 2013

(54) NON-VOLATILE MEMORY DEVICE AND READ METHOD THEREOF

(75) Inventors: Sangyong Yoon, Seoul (KR); Ki-tae Park, Seongnam-si (KR); Hongrak Son, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 125 days.

(21) Appl. No.: 13/221,162

(22) Filed: Aug. 30, 2011

(65) Prior Publication Data

US 2012/0134207 A1    May 31, 2012

(30) Foreign Application Priority Data

Nov. 25, 2010 (KR) .................... 10-2010-0117940

(51) Int. Cl.
*G11C 16/04*        (2006.01)

(52) U.S. Cl.
USPC ............ 365/185.03; 365/189.04; 365/210.12; 365/185.09

(58) Field of Classification Search
CPC ........... G11C 11/5642; G11C 16/0483; G11C 16/26; G11C 2211/5634; G11C 7/04

USPC ............ 365/185.03, 185.18, 189.04, 219.12, 365/185.09

See application file for complete search history.

(56) References Cited

U.S. PATENT DOCUMENTS

| | | |
|---|---|---|
| 7,644,224 B2 | 1/2010 | Murin et al. |
| 2007/0113000 A1 | 5/2007 | Murin et al. |
| 2008/0244338 A1 | 10/2008 | Mokhlesi et al. |
| 2009/0106485 A1 | 4/2009 | Anholt |
| 2010/0223538 A1* | 9/2010 | Sakurada ...................... 714/801 |

FOREIGN PATENT DOCUMENTS

KR    1020090075101 A    7/2009

* cited by examiner

*Primary Examiner* — Thong Q Le
(74) *Attorney, Agent, or Firm* — Harness, Dickey & Pierce, P.L.C.

(57) ABSTRACT

In one embodiment, the method for reading memory cells in an array of non-volatile memory cells includes reading data from a memory cell using a set of hard decision voltages and at least a first set of soft decision voltages based on a single read command.

33 Claims, 27 Drawing Sheets

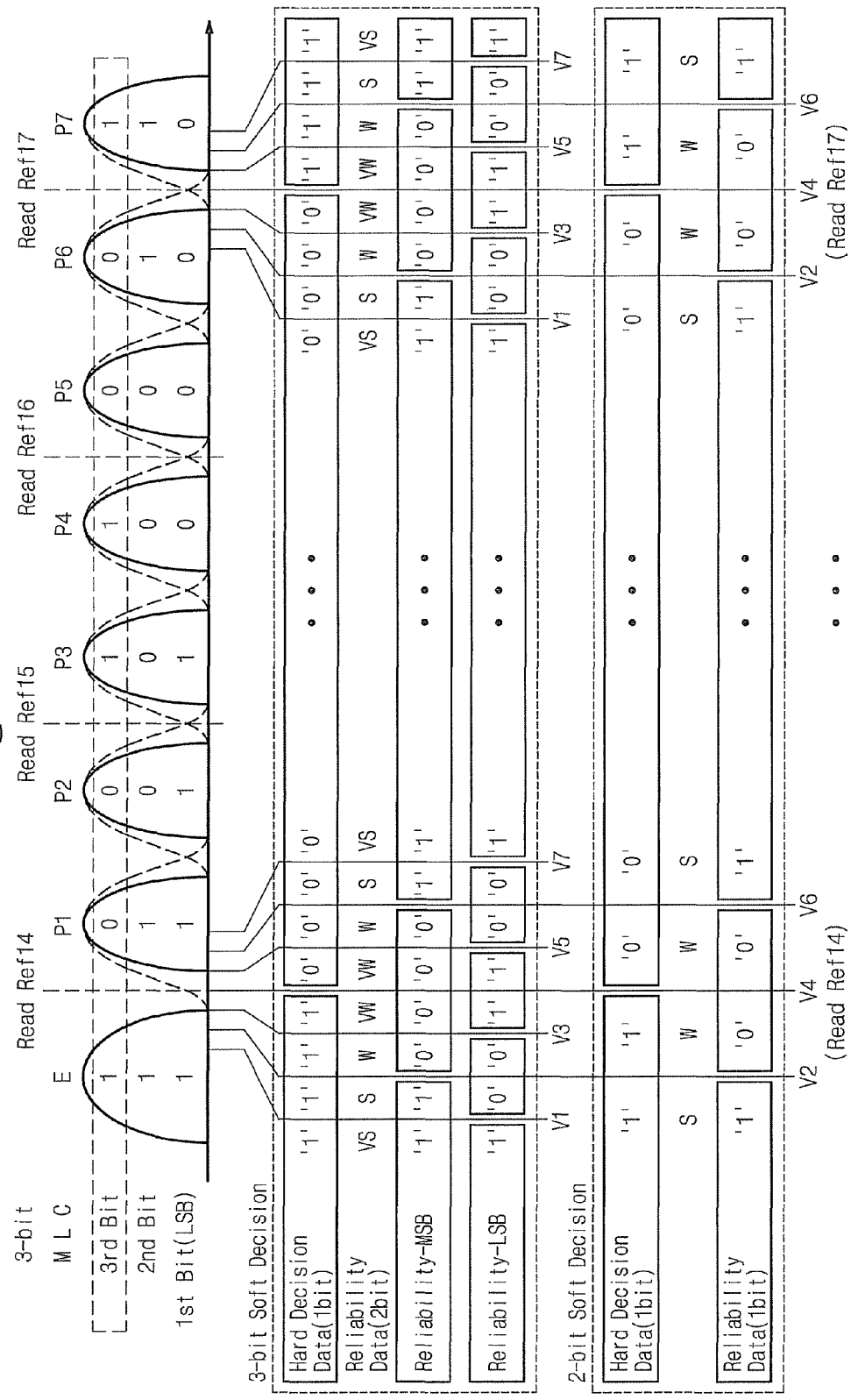

NON-VOLATILE MEMORY DEVICE AND READ METHOD THEREOF

CROSS-REFERENCE TO RELATED APPLICATIONS

This U.S. non-provisional patent application claims priority under 35 U.S.C. §119 of Korean Patent Application No. 10-2010-0117940, filed on Nov. 25, 2010, the entire contents of which are hereby incorporated by reference.

BACKGROUND

The present disclosure herein relates to semiconductor memory devices, and more particularly, to a flash memory device and a read method thereof.

Semiconductor memory devices are generally classified into volatile memory devices (e.g., DRAMs and SRAMs) and nonvolatile memory devices (e.g., EEPROMs, FRAMs, PRAMs, MRAMs, and flash memories). A volatile memory device loses data stored therein when power supply thereto is interrupted; whereas a nonvolatile memory device retains data stored therein even when power supply thereto is interrupted. In particular, a flash memory device is widely used as a storage medium in a computer system because of its high program speed, low power consumption and large data storage capacity.

In the flash memory device, data states storable in each memory cell may be determined according to the number of bits stored in the memory cell. A memory cell storing 1-bit data per cell is called a single-bit cell or a single-level cell (SLC), and a memory cell storing multi-bit data (i.e., at least 2-bit data) per cell is called a multi-bit cell, a multi-level cell (MLC) or a multi-state cell. The multi-bit cell is advantageous for high integration. However, as the number of bits programmed in each memory cell increases, the reliability decreases and the read failure rate increases.

For example, if k bits are to be programmed in a memory cell, one of $2^k$ threshold voltages must be formed in the memory cell. Due to the minute difference between the electrical characteristics of memory cells, the threshold voltages of memory cells programmed with the same data may form a desired (or, alternative a predetermined) range of threshold voltage distribution. Threshold voltage distributions may correspond respectively to $2^k$ data values that may be generated by k bits.

However, a voltage window available for threshold voltage distributions is limited. Therefore, as the value k increases, the distance between the threshold voltage distributions decreases and the adjacent threshold voltage distributions may overlap each other. As the adjacent threshold voltage distributions overlap each other, read data may include a number of error bits (e.g., several error bits or several tens of error bits).

SUMMARY

The present disclosure provides a non-volatile memory device and/or a read method thereof, which can improve the error correction efficiency while minimizing the performance loss caused by an error correction operation.

The present disclosure also provides a non-volatile memory device and/or a read method thereof, which can reduce the overhead of a read/output operation on data to be used for error correction.

The present disclosure also provides a non-volatile memory device and/or a read method thereof, which can improve the reliability of data read from the flash memory device.

In one embodiment, the method for reading memory cells in an array of non-volatile memory cells includes reading data from a memory cell using a set of hard decision voltages and at least a first set of soft decision voltages based on a single read command.

In another embodiment, the method for reading memory cells in an array of non-volatile memory cells includes sending a read command, sending a first read out command, and receiving first read results in response to the first read out command. The first read results are based on a read operation using a set of hard decision voltages. The method further includes first determining if errors in the first read results are correctable, and sending a second read out command without sending an associated read out command if the first determining determines errors in the first read results are not correctable. Second read results are received in response to the second read command, and the second read results are based on a read operation using a first set of soft decision voltages.

In one embodiment, a non-volatile memory device includes an array of non-volatile memory cells, and control logic configured to read data from a memory cell array using a set of hard decision voltages and at least a first set of soft decision voltages based on a single read command.

Embodiments are also directed to a data storage system, electronic device, computing system, etc. and method of operation associated therewith that incorporate an embodiment of the memory device or method of reading memory cells according to the present invention.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings:

FIGS. 6A to 6E are diagrams illustrating threshold voltage distributions for each cell of a 3-bit flash memory device and a 2-bit flash memory device and reliability data applicable thereto;

DETAILED DESCRIPTION OF EXAMPLE EMBODIMENTS

Figure 1:
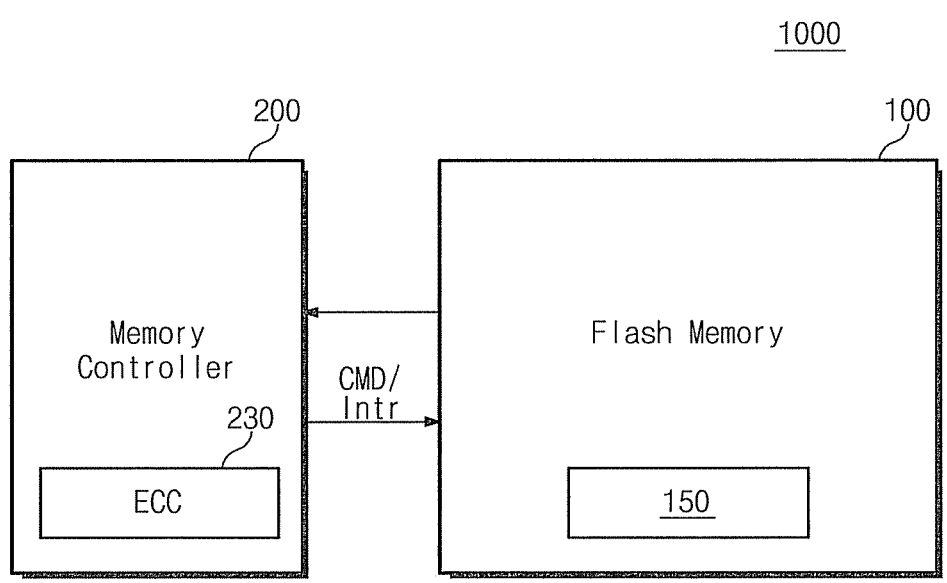
FIG. 1 is a block diagram illustrating a schematic structure of a memory system including a flash memory device according to an example embodiment of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing.

FIG. 1 is a block diagram illustrating a schematic structure of a memory system 1000 including a flash memory device 100 according to an example embodiment of the inventive concepts.

Referring to FIG. 1, the memory system 1000 may include a flash memory device 100 and a memory controller 200. The memory controller 200 may be configured to control the flash memory device 100. The memory controller 200 may include an error correction circuit (ECC) 230 for correcting an error in data read from the flash memory device 100. The ECC 230 may use a hard decision scheme or a soft decision scheme as an error correction scheme.

The hard decision scheme corrects an error in data by using only an error correction code and data (hereinafter referred to as hard decision data) that are read according to the on/off characteristics of a memory cell when a desired (or, alternative a predetermined) reference voltage (e.g., Read Ref) (see V4 of FIGS. 6A to 6E) is applied thereto. The soft decision scheme corrects an error in data by using not only the error correction code and the hard decision data but also additional information (hereinafter referred to as reliability data) about the reliability of the hard decision data. As an example, the inventive concepts illustrate the case where the ECC 230 uses a soft decision scheme to perform more accurate error correction. The reliability data encoding scheme and the number of bits of reliability data applicable to the ECC 230 are not limited to a specific embodiment but may vary according to various embodiments.

As will be described below, the flash memory device 100 of the inventive concepts may perform a soft decision read operation according to a desired (or, alternative a predetermined) soft decision read resolution and latch each bit of reliability data and hard decision data, corresponding to the soft decision read resolution, in a page buffer. Thereafter, under the control of the control logic 150, the flash memory device 100 of the inventive concepts may sequentially and selectively output the bits (e.g., most significant bits (MSBs) and least significant bits (LSBs)) of reliability data and hard decision data read by a soft decision read operation, to the ECC 230. In an example embodiment, one soft decision read command may be applied in the inventive concepts (that is, a soft decision read operation of a resolution 'n' is performed once, wherein n is an integer equal to or greater than 2), whereas a plurality of soft decision output commands may be generated for each bit (e.g., MSB and LSB) of reliability data and hard decision data. Meanwhile, a read/output operation on the bits (e.g., MSBs and LSBs) of reliability data and hard decision data according to the inventive concepts may be performed in parallel by a pipeline scheme such as a cache read mode.

The ECC 230 may perform an error correction operation based on hard decision data and an error correction operation based on the bits of reliability data, in a step-by-step manner, by using the bits of the reliability data and the hard decision data provided sequentially from the flash memory device 100. According to the result of the step-by-step error correction operation, the output of the bits of the reliability data from the flash memory device 100 to the ECC 230, and the next error correction operation using the same may be omitted. To this end, according to the result of the step-by-step error correction operation, the memory controller 200 may omit the generation of a soft decision output command CMD provided to the flash memory device 100, and may generate an interrupt signal Intr or a reset signal to the flash memory device 100.

The use of the above configuration of the inventive concepts can latch each bit of reliability data and hard decision data a desired (or, alternative a predetermined) soft decision read resolution in a page buffer and output the latched data selectively in response to a soft decision output command CMD. Consequently, the error correction accuracy can be increased gradually through a minimum data transmission operation even without transmitting massive amounts of data between the flash memory device 100 and the ECC 230 from the beginning. Consequently, the performance loss caused by the error correction operation can be minimized, and the error correction efficiency can be improved. Also, the overhead of a read/output operation on the data to be used for error correction can be reduced, and the reliability of data read from the flash memory device can be improved.

Figure 2:
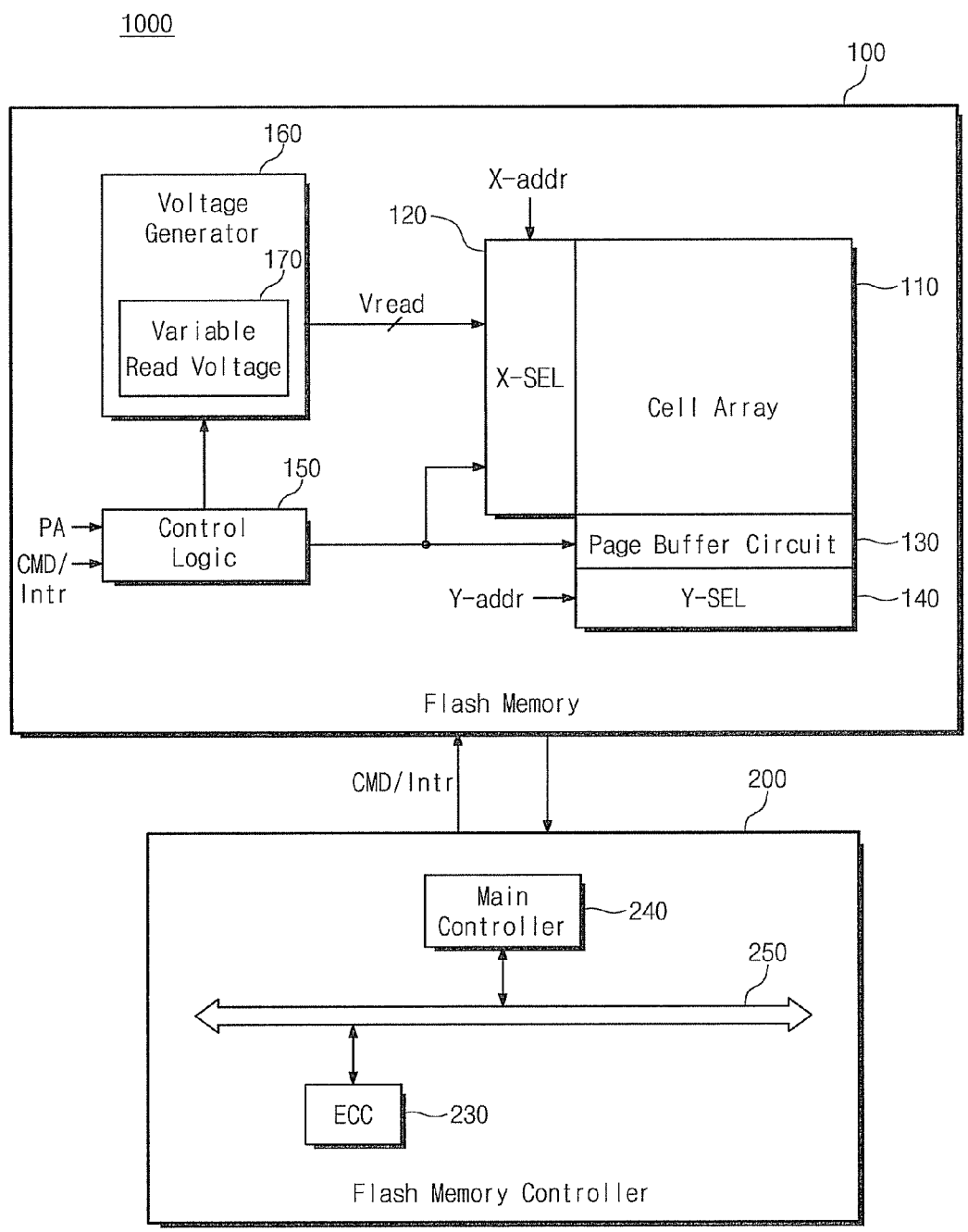
FIG. 2 is a block diagram illustrating a detailed structure of the memory system of FIG. 1 according to an example embodiment of the inventive concepts.
Figure 3:
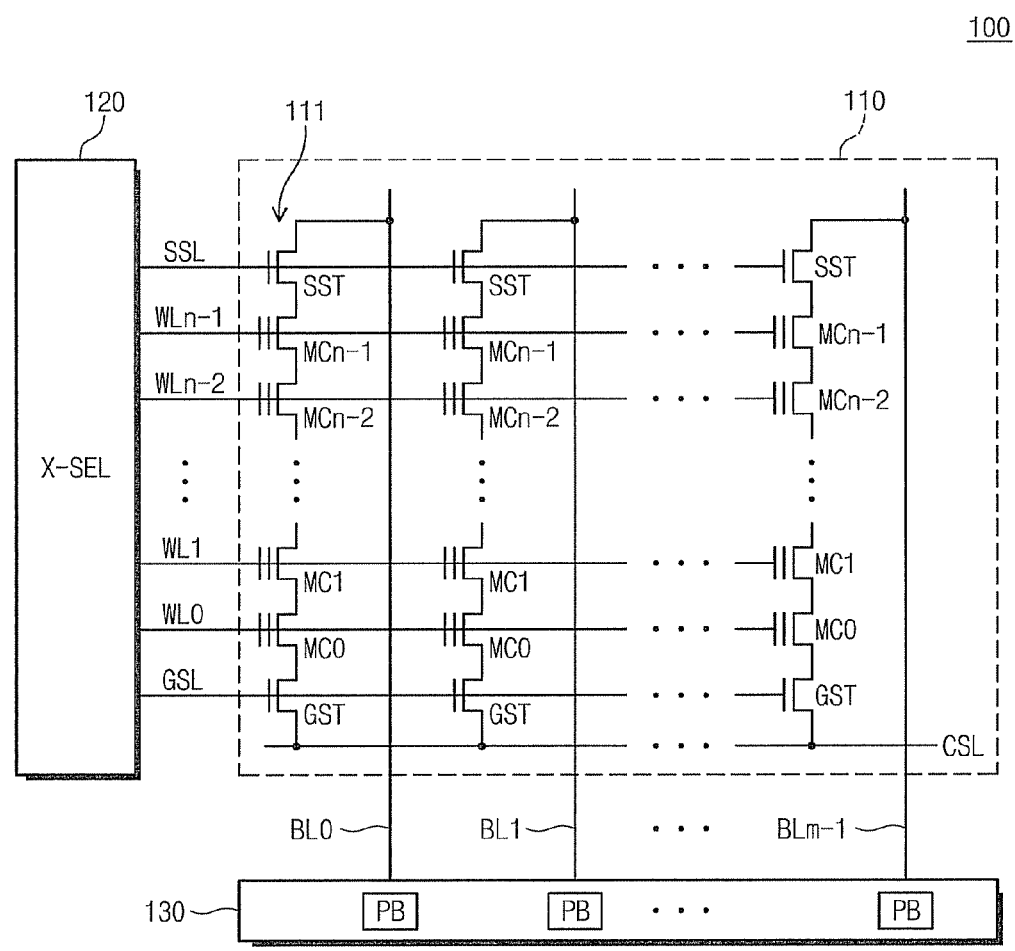
FIG. 3 is a block diagram illustrating a detailed structure of the flash memory device of FIGS. 1 and 2 according to an example embodiment of the inventive concepts.

FIG. 2 is a block diagram illustrating a detailed structure of the memory system 1000 of FIG. 1 according to an example embodiment of the inventive concepts. FIG. 3 is a block diagram illustrating a detailed structure of the flash memory device 100 of FIGS. 1 and 2 according to an example embodiment of the inventive concepts.

Referring to FIGS. 2 and 3, the flash memory device 100 may include a memory cell array 110, a row selector circuit (X-SEL) 120, a page buffer circuit 130, a column selector circuit (Y-SEL) 140, a control logic 150, and a voltage generator circuit 160. The voltage generator circuit 160 may include a variable read voltage generator 170. A flash memory controller 200 may include an error correction circuit (ECC) 230, a main controller 240, and a system bus 250.

As illustrated in FIG. 3, the memory cell array 110 may include a plurality of cell strings (or NAND strings) 111 connected respectively to bit lines BL0~BLm−1. The cell string 111 of each column may include at least one string selection transistor SST and at least one ground selection transistor GST. A plurality of memory cells (or memory cell transistors) MC0~MCn−1 may be connected in series between the selection transistors SST and GST. Each of the memory cells MC0~MCn−1 may include a multi-level cell (MLC) that stores multi-bit data per cell. The strings 111 may be electrically connected to the corresponding bit lines BL0~BLm−1, respectively.

FIG. 3 illustrates an example case where the flash memory device 100 is a NAND flash memory. However, the flash memory device 100 of the inventive concepts is not limited to a NAND flash memory. For example, the memory cell array 110 may be configured to include a NOR flash memory, a hybrid flash memory with a hybrid of at least two types of memory cells, or a One-NAND flash memory with a controller embedded in a memory chip. The operation characteristics of the flash memory device 100 according to the inventive concepts may be applicable not only to a flash memory with a charge storage layer including a conductive floating gate, but also to a charge trap flash (CTF) memory with a charge storage layer including a dielectric layer.

The control logic 150 may control an overall operation related to a program/erase/read operation. According to operation modes, the voltage generator circuit 160 may generate word line voltages (e.g., a program voltage Vpgm, a read voltage Vread, and a pass voltage Vpass) to be supplied to the respective word lines, and a voltage to be supplied to a bulk (e.g., a well region) including memory cells. The voltage generating operation of the voltage generator circuit 160 may be controlled by the control logic 150. The read voltage Vread among the word line voltages generated by the voltage generator circuit 160 may be used as a reference read voltage (corresponding to V4 of FIGS. 6A to 6E). The voltage generator circuit 160 may include the variable read voltage generator 170 to generate a plurality of variable read voltages with a desired (or, alternative a predetermined) voltage difference on the basis of the reference read voltage. The variable read voltages may be applicable to a soft decision read operation.

In response to the control of the control logic 150, the row selector circuit 120 may select one of the memory blocks (or sectors) of the memory cell array 110 and may select one of the word lines of the selected memory block. In response to the control of the control logic 150, the row selector circuit 120 may provide the word line voltages, generated by the voltage generator circuit 160, respectively to the selected word line and the unselected word lines.

The page buffer circuit 130 may be controlled by the control logic 150 to operate as a sense amplifier or a write driver according to an operation mode.

For example, in a verify/normal read operation, the page buffer circuit 130 operates as a sense amplifier for reading data from the memory cell array 110. In a normal read operation, the column selector circuit 140 outputs data, read from the page buffer circuit 130, to an external device (e.g., the memory controller 200 or a host) in response to column address information Y-addr. In a verify read operation, the read data may be provided to a pass/fail verification circuit (not illustrated) in the flash memory device 100 to determine the program pass/fail of the memory cells.

In a program operation, the page buffer circuit 130 operates as a write driver that drives the bit lines according to the data to be stored in the memory cell array 110. In a program operation, the page buffer circuit 130 receives data, which is to be written in the memory cell array 110, from a buffer (not illustrated) and drives the bit lines according to the received data.

The page buffer circuit 130 may include a plurality of page buffers PB (e.g., one or more pages) corresponding respectively to columns (or bit lines) or column pairs (or bit line pairs). Each of the page buffers PB may include a plurality of latches (see S, U, M, L and C of FIG. 12). The latches may latch a plurality of reliability data bits and soft decision data read from the page buffer PB. The value of the reliability data bits may be determined by encoding the data read through a soft decision read operation. The encoding operation for determining the reliability data bit value may be performed in the page buffer circuit 130 or may be performed by an external device (e.g., a memory controller) of the page buffer circuit 130.

Figure 4:
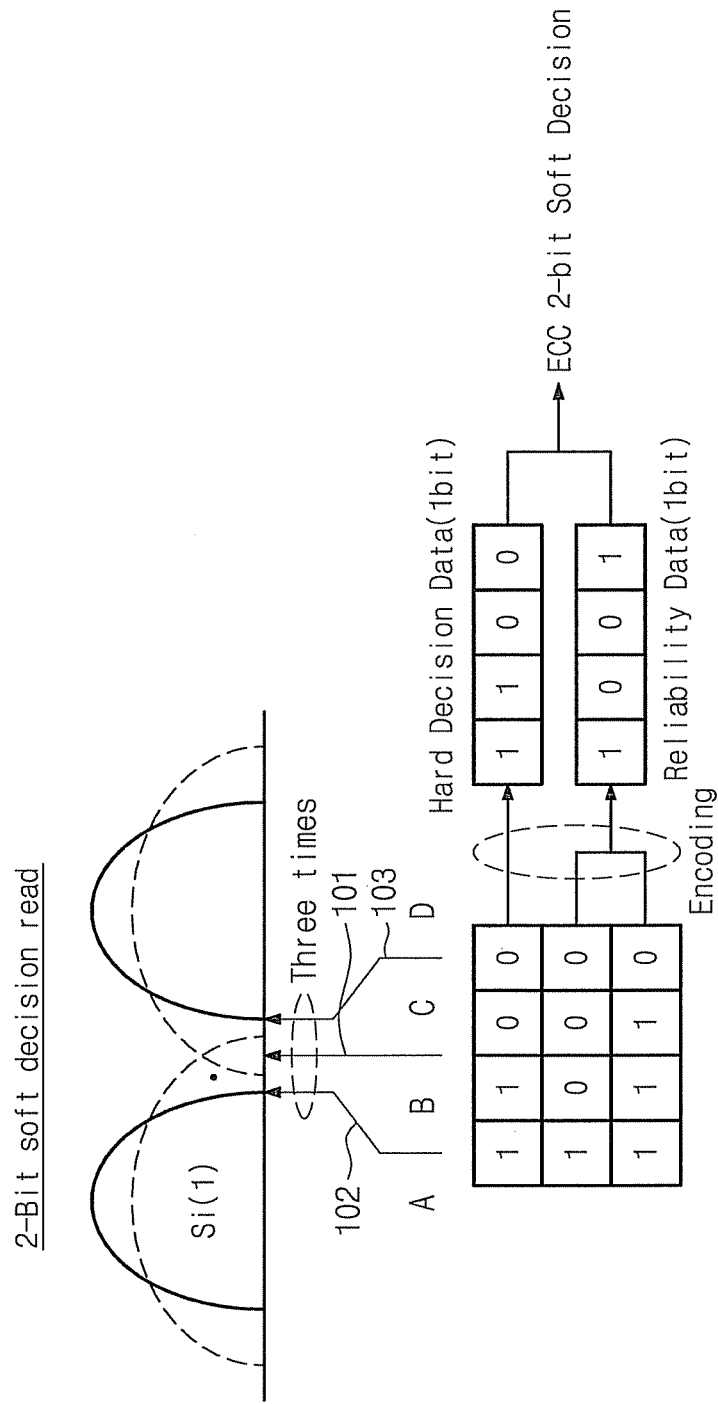
FIG. 4 is a diagram illustrating a 2-bit soft decision read operation.
Figure 5:
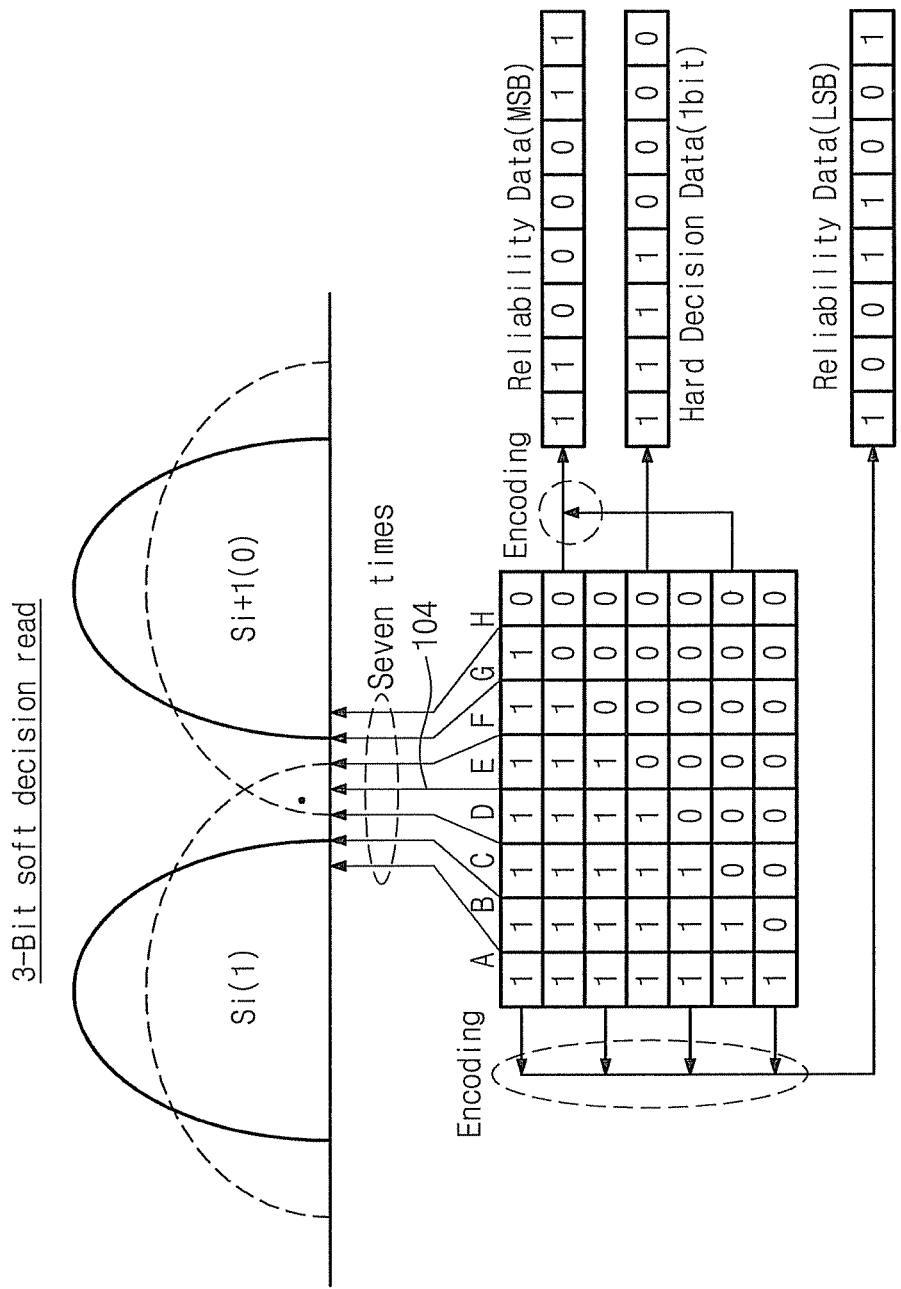
FIG. 5 is a diagram illustrating a 3-bit soft decision read operation.

FIG. 4 is a diagram illustrating a 2-bit soft decision read operation. FIG. 5 is a diagram illustrating a 3-bit soft decision read operation.

Referring to FIG. 4, ideally, data states programmed in a memory cell maintain a desired (or, alternative a predetermined) voltage interval with adjacent data states to secure a sufficient read margin. A reference read voltage may be set on the basis of ideal data states. Ideal data states Si and Si+1 represented by solid lines in FIGS. 4 and 5 may be divided by a reference read voltage denoted by a reference numeral '101'. A read operation performed using the reference read voltage 101 is called a hard decision read operation.

However, each data state may be deformed to an non-ideal shape as represented by dotted lines in FIGS. 4 and 5. If the data states Si and Si+1 represented by solid lines are deformed as represented by dotted lines, it is difficult to distinguish between the deformed data states Si and Si+1 by using only a hard decision read operation. This problem becomes more serious as the number of bits of data stored in a memory cell increases. Also, the problem becomes more serious due to various factors such as a charge loss, a time elapse, a temperature increase, a coupling caused when programming adjacent cells, an adjacent cell read, and a cell defect.

In this case, the deformed data states Si and Si+1 may be distinguished through a soft decision read operation. The reliability data obtained by the soft decision read operation may be provided to the ECC 230 together with the hard decision data, and may be used to correct a possible error in the deformed data states Si and Si+1.

The soft decision read operation may have a desired (or, alternative a predetermined) read resolution. As the read resolution increases, the read/sense count during the soft decision read operation increases. For example, the data of a memory cell represented by a black dot (•) may be discerned by a 2-bit soft decision read operation. The 2-bit soft decision read operation may include three read operations that are performed sequentially on the basis of read voltages 101, 102 and 103. In the soft decision read operation, the data read through the three read operations may be encoded to generate 1-bit actual data (or hard decision data) and 1-bit reliability data. The actual (hard decision) data may be determined as '1' or '0' according to the value of the reliability data in the ECC 230. The reliability data (1-bit), as shown in FIG. 4, is obtained or encoded by an exclusive NOR operation on the read results of the read voltages 102 and 103.

The read resolution applied to the soft decision read operation may increase for a more accurate data decision. As the read resolution increases, the read/sense count during the soft decision read operation increases.

Referring to FIG. 5, the data of a memory cell represented by a black dot (•) may be discerned by a 3-bit soft decision read operation. The 3-bit soft decision read operation may include seven read operations that are performed on the basis of seven read voltages. The data read through the seven read operations may be encoded into 1-bit actual data (or hard decision data) and 2-bit reliability data. The actual data may be determined as '1' or '0' according to the value of the 2-bit reliability data in the ECC 230. The most significant bit (MSB) of the reliability data, as shown in FIG. 5, is obtained or encoded in the same manner as described above to obtain the reliability data in FIG. 4 using the second and sixth read voltages. The least significant bit (LSB) of the reliability data, as shown in FIG. 5, is obtained or encoded by: obtaining a first exclusive NOR results from the read results of the first and third read voltages, obtaining a second exclusive NOR results from the read results of the fifth and seventh read voltages, and performing an AND operation on the first and second exclusive NOR results.

A method of determining, by the ECC 230, the value of actual data on the basis of m-bit (m: an integer equal to or greater than 1) reliability data may vary according to the configuration of an error correction engine provided in the ECC 230. Also, m-bit reliability data may be encoded, in various ways, from a plurality of data read in a soft decision read operation. The inventive concepts illustrate the case where m-bit reliability data are encoded in the page buffer PB of the flash memory device 100.

In an example embodiment, when latching a plurality of data read in a soft decision read operation, each page buffer PB may be configured to encode the data into reliability data of a desired (or, alternative a predetermined) number of bits (e.g., m-bit reliability data). For example, the page buffer circuit 130 may directly convert (or encode) a plurality of data into reliability data of a desired (or, alternative a predetermined) number of bits, by toggling the data value stored in a latch, whenever data of a desired (or, alternative a predetermined) value (e.g., 0) are read from the page buffer PB in a soft decision read operation.

According to an encoding scheme of the page buffer PB that encodes reliability data from a plurality of data read from the page buffer PB in a soft decision read operation, the page buffer PB may generate reliability data of a desired (or, alternative a predetermined) number of bits even without providing an additional circuit (e.g., an encoder) in the flash memory device 100 or the memory controller 200. Accordingly, the chip size can be reduced, the amount of data to be transmitted from the flash memory device 100 to the ECC 230 can be reduced, and the data transmission rate between the flash memory device 100 and the ECC 230 can be improved. The reliability data encoding scheme described above is not limited to a specific embodiment but may vary according to various embodiments.

FIGS. 6A to 6E are diagrams illustrating threshold voltage distributions for each cell of a 3-bit flash memory device and a 2-bit flash memory device and reliability data applicable thereto.

Figure 6A:
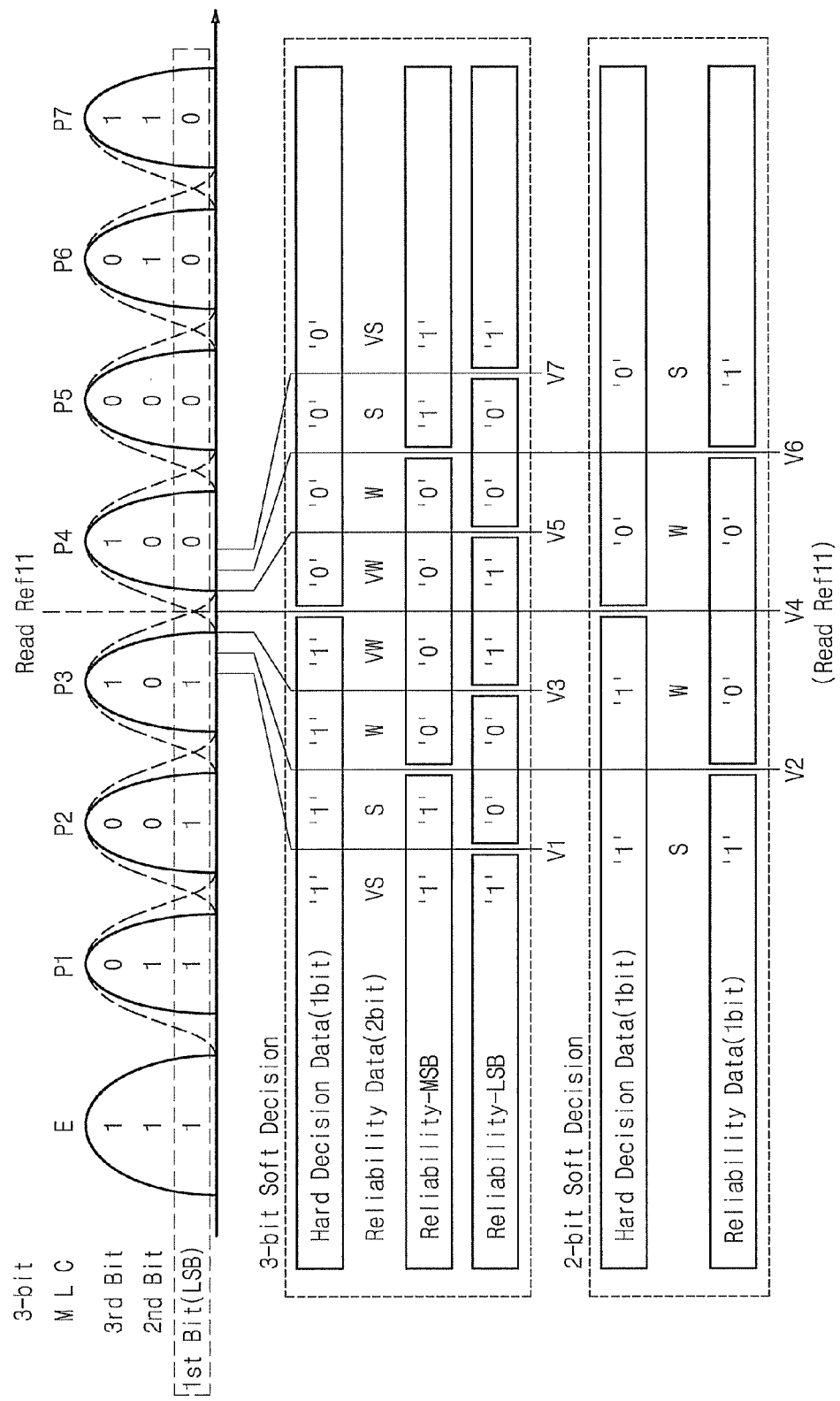
Figure 6B:
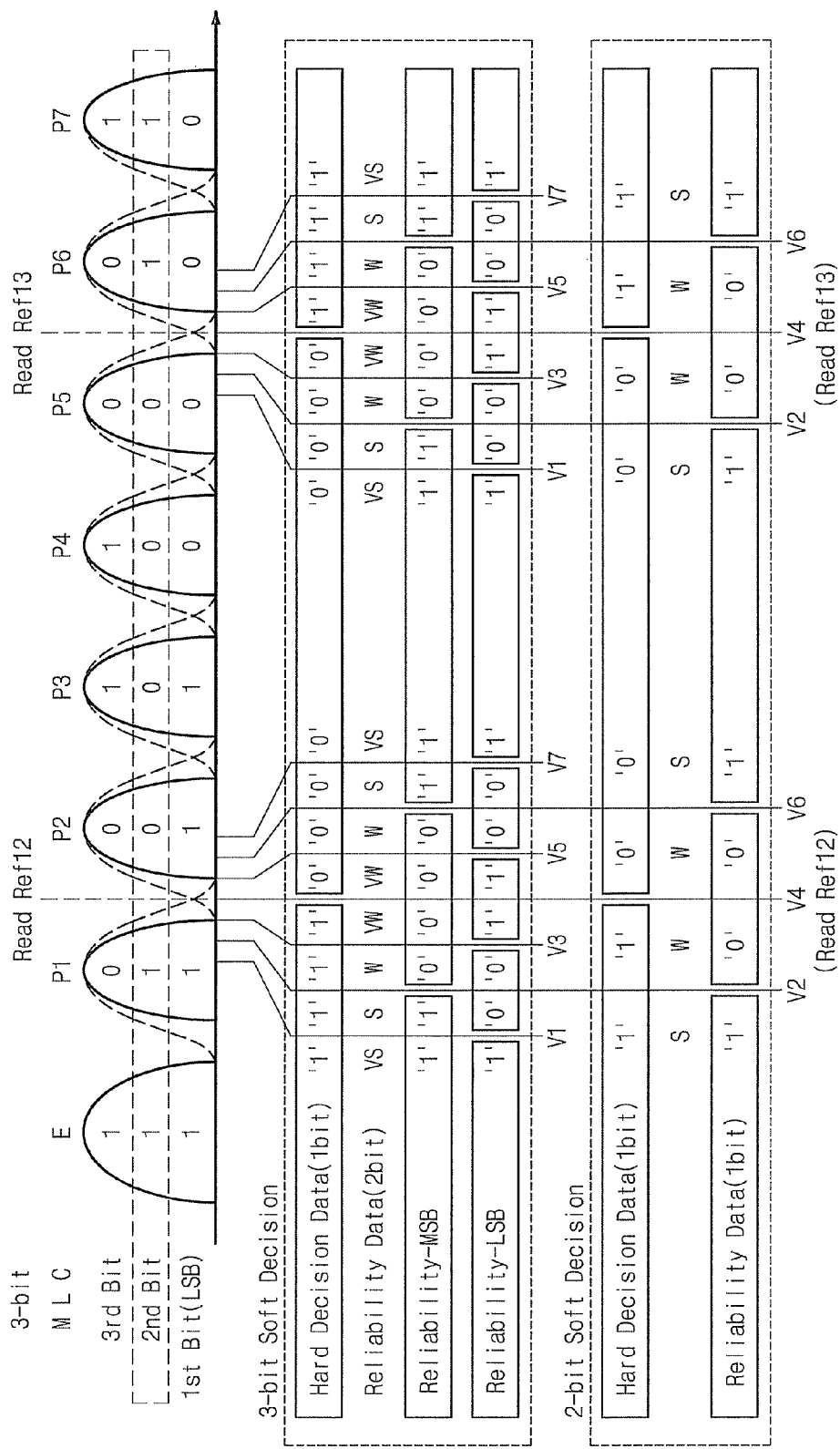
Figure 6D:
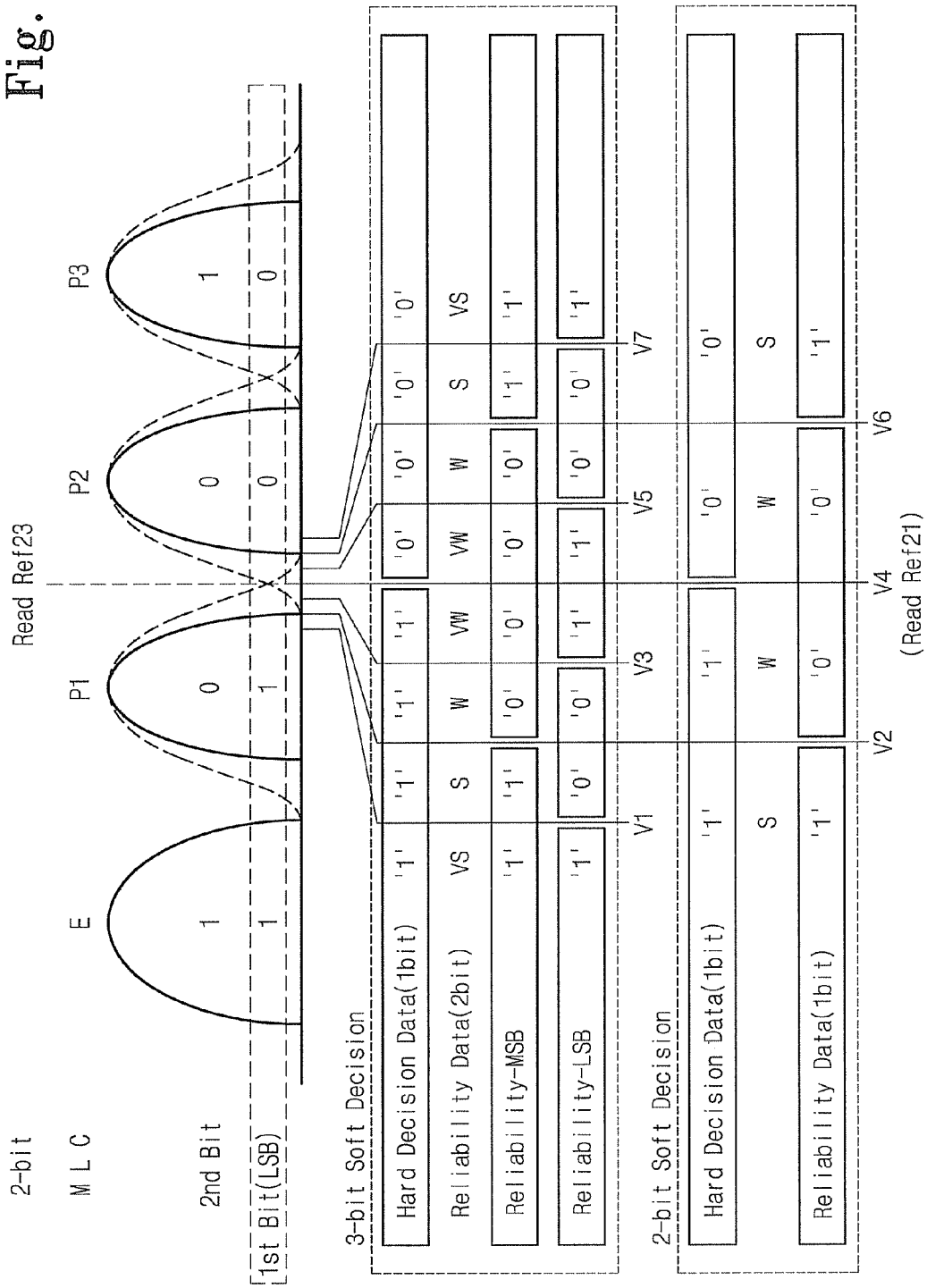
Figure 6E:
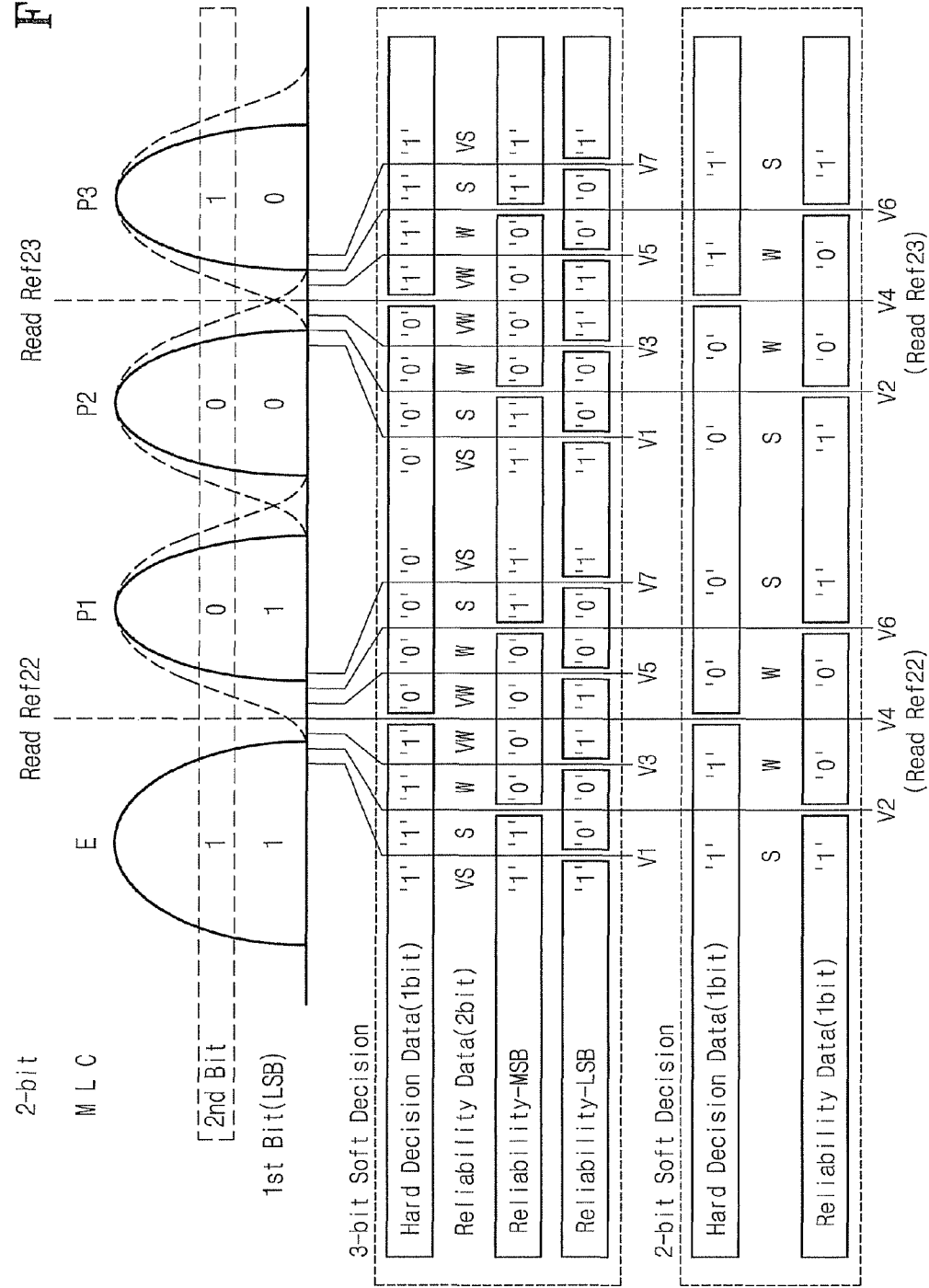

As illustrated in FIGS. 6A to 6C, the threshold voltage of a memory cell with 3-bit data programmed per cell (i.e., a 3-bit MLC) may correspond to one of 8-level data states E and P1~P7. As illustrated in FIGS. 6D to 6E, the threshold voltage of a memory cell with 2-bit data programmed per cell (i.e., a 2-bit MLC) may correspond to one of 4-level data states E and P1~P3.

Each data state may form a desired (or, alternative a predetermined) threshold voltage window. The ideal data state of the programmed MLC maintains a desired (or, alternative a predetermined) voltage interval with an adjacent data state to secure a sufficient read margin. However, in actual implementation of the multi-bit flash memory device, the threshold voltage distribution of each data state may be deformed to an non-ideal shape as represented by dotted lines of FIGS. 6A to 6E.

For more accurate data decision and error correction, the inventive concepts may use a soft decision read scheme that performs a read operation a number of times by using a plurality of variable read voltages as well as a reference read voltage. If a plurality of data bits are stored in each memory cell (e.g., 3-bit MLC and 2-bit MLC), each bit stored in each memory cell may be read independently. For example, FIG. 6A illustrates the configuration of data outputted when the first bit (i.e., LSB) stored in a 3-bit MLC is read by a soft decision read method. FIG. 6B illustrates the configuration of data outputted when the second bit stored in the 3-bit MLC is read by a soft decision read method. FIG. 6C illustrates the configuration of data outputted when the third bit stored in the 3-bit MLC is read by a soft decision read method. FIG. 6D illustrates the configuration of data outputted when the first bit stored in a 2-bit MLC is read by a soft decision read method. FIG. 6E illustrates the configuration of data outputted when the second bit stored in the 2-bit MLC is read by a soft decision read method.

A soft decision read operation according to the inventive concepts may have a desired (or, alternative a predetermined) soft decision read resolution. For example, one of a 2-bit soft decision read resolution and a 3-bit soft decision read resolution may be applied to read each bit stored in a 3-bit MLC. Also, one of a 2-bit soft decision read resolution and a 3-bit soft decision read resolution may be applied to read each bit stored in a 2-bit MLC.

A soft decision read resolution according to the inventive concepts may be set by soft decision read resolution information provided to the flash memory device 100 together with a soft decision read command. A soft decision read operation according to the inventive concepts may include one soft decision read command and one or more soft decision output commands. Each of the soft decision output commands may be generated separately with respect to each bit (e.g., MSB and LSB) of reliability data and hard decision data.

Table 1 shows the configuration of data outputted from each page buffer PB in a 2-bit soft decision read operation.

TABLE 1

| Hard Decision Data | Reliability Data | Meaning |
|---|---|---|
| 0 | 1 | Strong 0 |
|   | 0 | Weak 0 |
| 1 | 1 | Strong 1 |
|   | 0 | Weak 1 |

Referring to FIGS. 6A to 6E and Table 1, in a 2-bit soft decision read operation, each page buffer PB corresponding to each bit line (or a bit line pair) may output 2-bit data to the ECC 230. The 1-bit value outputted from the page buffer PB is the data read by a reference read voltage (i.e., V4), which corresponds to a hard decision data value. Also, the other 1-bit data outputted from the page buffer PB is a reliability data value, which corresponds to the encoding result of data read by two variable read voltages (i.e., V2 and V6).

The reliability data are probability information indicating whether the corresponding hard decision data have been correctly decided. If the reliability data value is '1', it means that the reliability of the corresponding hard decision data is high (strong (S)). If the reliability data value is '0', it means that the reliability of the corresponding hard decision data is low (weak (W)).

Table 2 shows the configuration of data outputted from each page buffer PB in a 3-bit soft decision read operation.

TABLE 2

| Hard Decision Data | Reliability Data (MSB) | Reliability Data (LSB) | Meaning |
|---|---|---|---|
| 0 | 1 | 1 | Very Strong 0 |
|   |   | 0 | Strong 0 |
|   | 0 | 0 | Weak 0 |
|   |   | 1 | Very Weak 0 |
| 1 | 1 | 1 | Very Strong 1 |
|   |   | 0 | Strong 1 |
|   | 0 | 0 | Weak 1 |
|   |   | 1 | Very Weak 1 |

Referring to FIGS. 6A to 6E and Table 2, in a 3-bit soft decision read operation with a 3-bit resolution; each page buffer PB may output 3-bit data to the ECC 230. The outputted 3-bit data may include 1-bit hard decision data and 2-bit reliability data.

The 1-bit hard decision data value obtained through the 3-bit soft decision read operation may be read when a reference read voltage (i.e., V4) is applied. The MSB value among the 2-bit reliability data values may correspond to the encoding result of data read when two variable read voltages (i.e., V2 and V6) are applied. As illustrated in FIGS. 6A to 6E, the MSB value of the reliability data may be substantially identical to the 1-bit reliability data value obtained through the 2-bit soft decision read operation. This means that the error correction operation based on the MSB value of the reliability data is substantially identical to the error correction operation based on the reliability data value obtained through the 2-bit soft decision read operation. Thus, according to the inventive concepts, like the value obtained by the 2-bit soft decision read operation, the MSB value of the reliability data obtained by the 3-bit soft decision read operation may be used to perform an error correction operation. Consequently, even without performing the 2-bit soft decision read operation, using a portion of the data obtained by the 3-bit soft decision read operation can provide the same effect as the case of performing an error correction operation by using the reliability data outputted in the 2-bit soft decision read operation.

The LSB value among the 2-bit reliability data values may correspond to the encoding results of data read when four variable read voltages (i.e., V1, V3, V5 and V7) are applied. The LSB value of the reliability data corresponds to a subdivision of a probability region decidable by the MSB value of the reliability data (the reliability data value obtained through the 2-bit soft decision read operation). That is, the MSB value of the reliability data may divide the reliability of the corresponding hard decision data into a strong (S) one and a weak (W) one, whereas the LSB value of the reliability data may subdivide the reliability of the corresponding hard decision data into a very strong (VS) one, a strong (S) one, a weak (W) one and a very weak (VW) one.

As described above, the soft-decision error correction operation has a better error correction performance than the hard-decision error correction operation using only the hard decision data. Herein, when the resolution in the soft decision read operation increases, the accuracy of reliability information increases, thus improving the error correction performance. However, as the resolution in the soft decision read operation increases, the necessary read count and the capacity of the read data increase, thus increasing the time taken to read data by the flash memory device 100 and the time taken to transmit the read data from the flash memory device 100 to the ECC 230.

In order to prevent the above problem, the flash memory device 100 of the inventive concepts may perform only a high-resolution soft decision read operation (e.g., 3-bit soft decision read operation) without a low-resolution soft decision read operation (e.g., 2-bit soft decision read operation) having substantially overlapping soft decision read results. In this case, the resolution of the soft decision read operation may be set by resolution information transmitted to the flash memory 100 together with a read command. The data obtained by the high-resolution soft decision read operation may be provided from the flash memory device 100 to the ECC 230 in ascending order of read resolution. To this end, the flash memory device 100 of the inventive concepts may sequentially output the data, obtained through the 3-bit soft decision read operation, to the ECC 230, instead of outputting all of the obtained data to the ECC 230 from the beginning. For example, the flash memory device 100 may sequentially output the hard decision data value (the data value read by the reference read voltage), the MSB value of the reliability data (corresponding to the reliability data value obtained through the 2-bit soft decision read operation), and the LSB value of the reliability data (corresponding to the LSB value of the reliability data obtained through the 3-bit soft decision read operation) to the ECC 230.

The ECC 230 may perform a step-by-step error correction operation in response to the hard decision data value, the MSB value of the reliability data, and the LSB value of the reliability data that are sequentially received from the flash memory device 100. For example, the ECC 230 may perform an error correction operation based on the hard decision data, an error correction operation based on the MSB value of the reliability data, and an error correction operation based on the LSB value of the reliability data, in a step-by-step manner.

The results of the step-by-step error correction operations performed by the ECC 230 may be used to determine whether to use each of the reliability data bits in an error correction operation. For example, if the error is correctable by the error correction operation based on the MSB value of the reliability data, a data output operation of the bit following the MSB of the reliability data and an error correction operation using the same are omitted or interrupted. That is, in response to the sequentially-provided soft decision read results, the ECC 230 may sequentially perform an error correction operation with a low accuracy and an error correction operation with a high accuracy. According to this configuration of the inventive concepts, only the data to be actually used in the step-by-step error correction operations may be sequentially transmitted to the flash memory device 100 and the ECC 230. Accordingly, the error correction efficiency can be improved while minimizing the performance loss caused by the error correction.

Also, in the soft decision read operation, the flash memory device 100 may perform the operations of reading/outputting the bits (e.g., MSB and LSB) of the reliability data and the hard decision data, in parallel by a pipeline scheme.

Figure 7A:
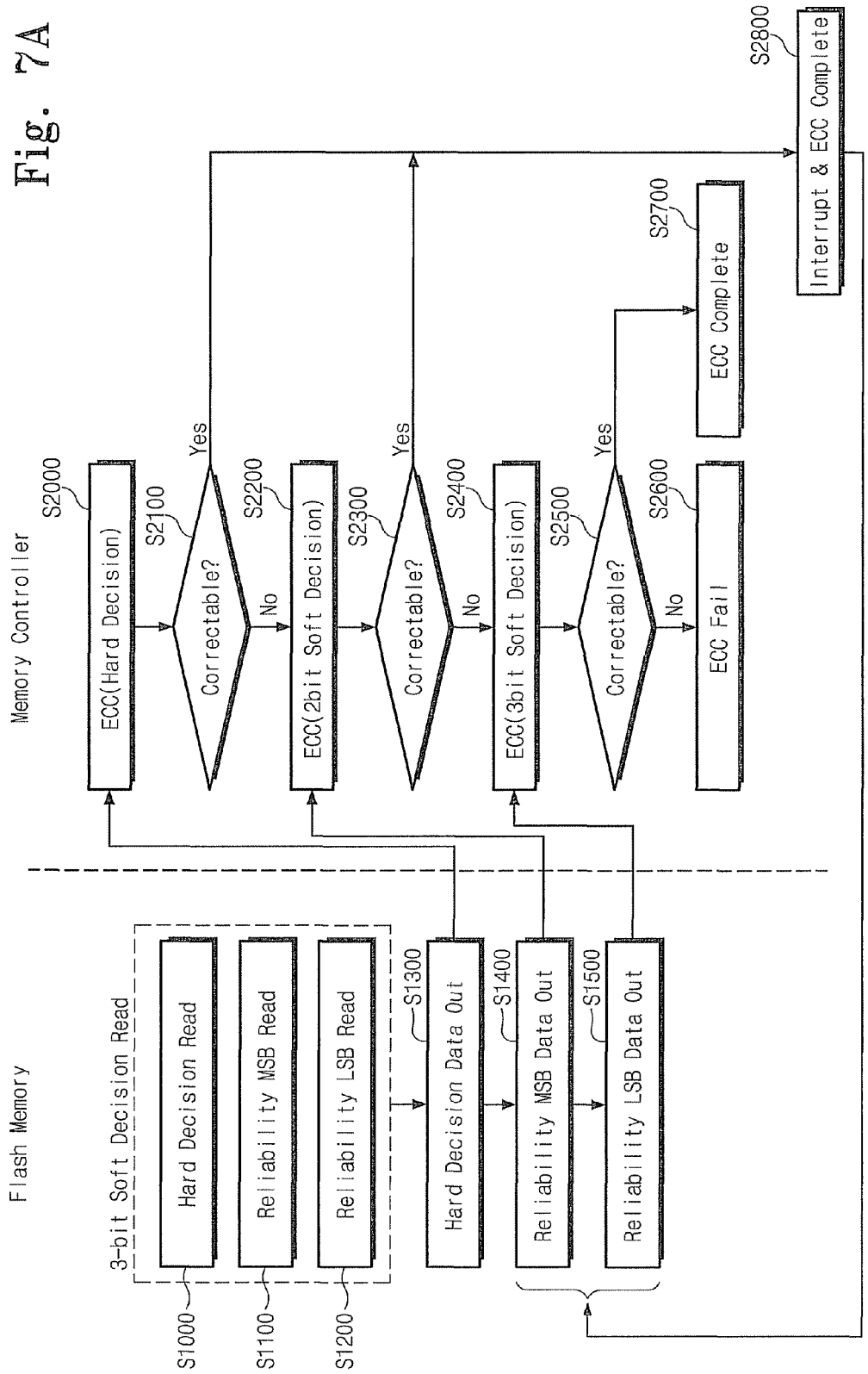
FIGS. 7A and 7B are flow diagrams illustrating soft decision read methods and error correction methods using the same according to a first example embodiment of the inventive concepts.
Figure 7B:
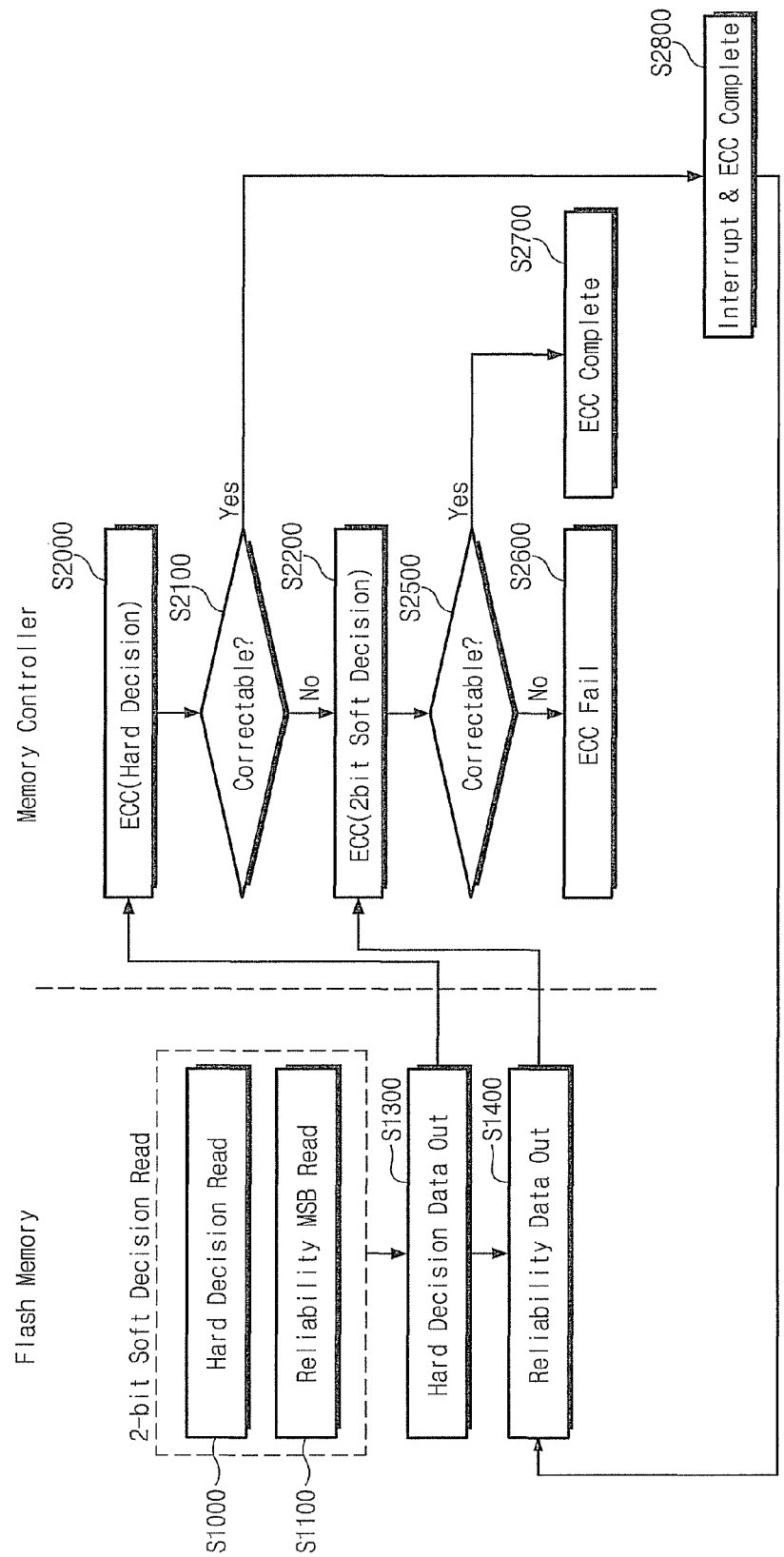
Figure 8:
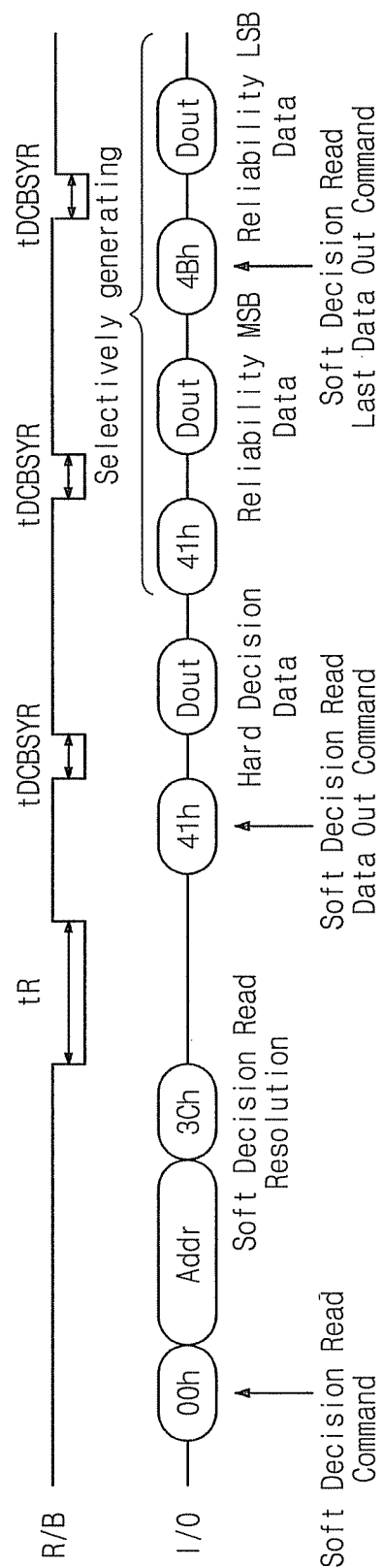
FIG. 8 is a timing diagram illustrating a soft decision read method and an error correction method using the same according to an example embodiment of the inventive concepts.
Figure 9:
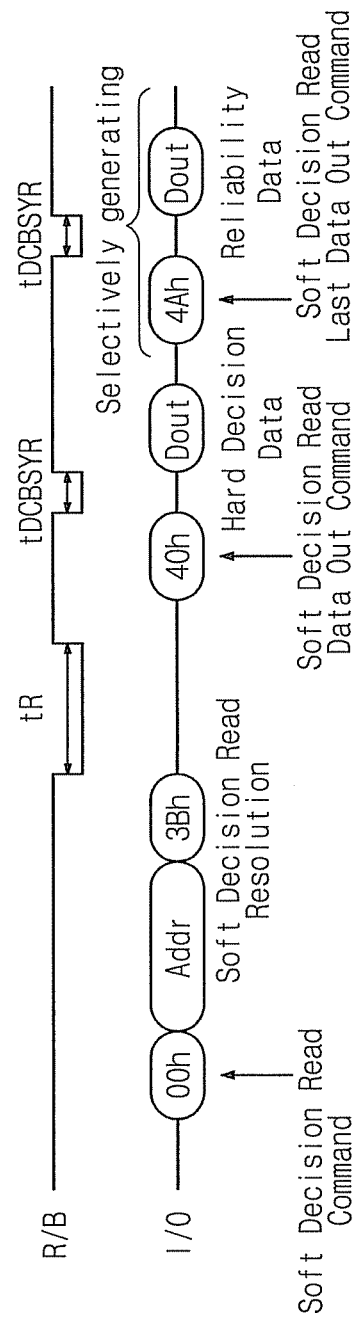
FIG. 9 is a timing diagram illustrating a soft decision read method and an error correction method using the same according to another example embodiment of the inventive concepts.

FIGS. 7A and 7B are flow diagrams illustrating soft decision read methods and error correction methods using the same according to a first example embodiment of the inventive concepts. FIGS. 8 and 9 are timing diagrams illustrating a soft decision read method and an error correction method using the same according to an example embodiment of the inventive concepts. FIGS. 7A and 8 illustrate a 3-bit soft decision read method and a command sequence corresponding thereto. FIGS. 7B and 9 illustrate a 2-bit soft decision read method and a command sequence corresponding thereto.

Referring to FIGS. 7A and 8, a soft decision read command may be inputted together with read resolution information (denoted by '3Ch' in FIG. 8) and an address Addr of a page on which a soft decision read operation will be performed. Herein, the read resolution information may be used to determine the number of bits of reliability data. The read resolution information denoted by '3Ch' in FIG. 8 may mean that a 3-bit soft decision read operation is performed by an inputted soft decision read command.

The flash memory device 100 may sequentially read hard decision data, the MSB of reliability data, and the LSB of the reliability data from the memory cells of the corresponding page in response to the soft decision read command 00h, the address Addr and the read resolution information 3Ch generated by the memory controller 200 (S1000, S1100 and S1200). In a 3-bit soft decision read operation, a read operation may be performed seven times, and 3-bit data (i.e., the hard decision data, the MSB of the reliability data, and the LSB of the reliability data) according to the read result of the 3-bit soft decision read operation may be latched in each page buffer PB. During the 3-bit soft decision read operation in the flash memory device 100, an RIB signal may change from a logic high state to a logic low state. After the 3-bit soft decision read operation in the flash memory device 100, the RIB signal may return from a logic low state to a logic high state.

Thereafter, the hard decision data, the MSB of the reliability data, and the LSB of the reliability data latched in each page buffer PB may be sequentially provided to the ECC 230 in response to a plurality of soft decision output commands generated by the memory controller 200.

For example, when the first soft decision output command (denoted by '41h' in FIG. 8) is inputted from the memory controller 200 to the flash memory device 100, the hard decision data latched in the page buffer PB of the flash memory device 100 may be outputted to the ECC 230 of the memory controller 200 (S1300). After the first soft decision output command 41h is inputted to the flash memory device 100, the RIB signal may change to a logic low state. Thereafter, after the lapse of a desired (or, alternative a predetermined) time, when the R/B signal returns from a logic low state to a logic high state, the hard decision data may be outputted from the flash memory device 100 to the ECC 230.

The ECC 230 may receive the hard decision data from the flash memory device 100 to perform an error correction operation based on the hard decision data (S2000). Thereafter, the ECC 230 determines whether all errors in the read data are correctable by the error correction operation of S2000 (i.e., the error correction operation based on the hard decision data) (S2100).

In an example embodiment, the flash memory device 100 may perform a hard decision read operation and a normal read operation on a page basis. One page may include eight sectors, and one sector may include 1 KB data. The ECC 230 may perform an error correction operation on a sector basis. In an error correction operation based on hard decision data, the number of errors correctable in one sector may be defined as 60. Herein, the number of the correctable errors is not limited to a specific embodiment but may vary according to various embodiments.

If it is determined that the error is correctable by the error correction operation based on the hard decision data (for example, if there are less than 60 errors per sector) (S2100), the error correction operation is completed without performing the operation of outputting the other soft decision data (i.e., the MSB of the reliability data and the LSB of the reliability data) (S2800). In this case, the generation of the second and third soft decision output commands 41h and 4Bh is omitted. If it is determined that the error is not correctable by the error correction operation based on the hard decision data (for example, if there are more than 60 errors per sector) (S2100), the second soft decision output command 41h is provided to the flash memory device 100.

The flash memory device 100 outputs the MSB of the reliability data to the ECC 230 in response to the second soft decision output command 41h (S1400). The ECC 230 receives the reliability data from the flash memory device 100. The ECC 230 performs an error correction operation by using the hard decision data provided in S1300 and the MSB of the reliability data provided in S1400 (S2200).

The error correction operation performed in S2200 substantially corresponds to an error correction operation based on the soft decision read results with a read resolution of 2. In comparison with the error correction operation based on the hard decision read results, the error correction operation based on the soft decision read results with a read resolution of 2 can further increase the error correction accuracy. An increase in the error correction accuracy may mean an increase in the number of errors correctable per sector. In an example embodiment, in the error correction operation based on the soft decision read results with a read resolution of 2, the number of errors correctable per sector may be defined as 80. Herein, the number of the correctable errors is not limited to a specific embodiment but may vary according to various embodiments.

Meanwhile, the MSB of the reliability data outputted in S1400 corresponds to the reliability data outputted in the 2-bit soft decision read operation as illustrated in FIG. 6. Thus, the error correction operation of S2200 is substantially identical to the error correction operation based on the reliability data outputted in the 2-bit soft decision read operation. That is, the inventive concepts can perform an error correction operation with a higher accuracy by selectively providing only the MSB of the reliability data among the data obtained in a soft decision read operation with a read resolution of 3 to the ECC 230 without performing a soft decision read operation with a read resolution of 2.

Thereafter, the ECC 230 determines whether an error in the read data is correctable by the error correction operation of S2200 (i.e., the error correction operation based on the MSB of the reliability data) (S2300).

If it is determined that the error is correctable by the error correction operation based on the MSB of the reliability data (for example, if there are less than 80 errors per sector) (S2300), the error correction operation is completed without performing the operation of outputting the other soft decision data (i.e., the LSB of the reliability data) (S2800). In this case, the generation of the third soft decision output command 4Bh is omitted. If it is determined that the error is not correctable by the error correction operation based on the MSB of the reliability data (for example, if there are more than 80 errors per sector) (S2300), the third soft decision output command 4Bh for outputting the last soft decision data (i.e., the LSB of the reliability data) is provided to the flash memory device 100. The flash memory device 100 outputs the LSB of the reliability data to the ECC 230 in response to the third soft decision output command 4Bh (S1500). The ECC 230 performs an error correction operation by using the hard decision data of S1300, the MSB of the reliability data of S1400, and the LSB of the reliability data of S1500 (S2400).

The LSB of the reliability data outputted in S1500 is a subdivision of the reliability data outputted in the 2-bit soft decision read operation as illustrated in FIGS. 6A to 6E, which corresponds to the reliability data that can be obtained only in the 3-bit soft decision read operation. Thus, the error correction operation of S2400 is substantially identical to the error correction operation based on the reliability data outputted in the 3-bit soft decision read operation. In comparison with the error correction operation based on the soft decision read results with a read resolution of 2, the error correction operation based on the soft decision read results with a read resolution of 3 can further increase the error correction accuracy. In an example embodiment, in the error correction operation based on the soft decision read results with a read resolution of 3, the number of errors correctable per sector may be defined as 110. Herein, the number of the correctable errors is not limited to a specific embodiment but may vary according to various embodiments.

Thereafter, the ECC 230 determines whether an error in the read data is correctable by the error correction operation of S2400 (i.e., the error correction operation based on the LSB of the reliability data) (S2500). If it is determined that the error is correctable by the error correction operation based on the LSB of the reliability data (for example, if there are less than 110 errors per sector) (S2500), the error correction operation is completed (S2700). If it is determined that the error is not correctable by the error correction operation based on the LSB of the reliability data (for example, if there are more than 110 errors per sector) (S2500), the error correction operation is determined as fail (S2600).

FIGS. 7B and 9 are diagrams illustrating a 2-bit soft decision read method and a command sequence corresponding thereto. FIG. 9 illustrates a command sequence corresponding to a 2-bit soft decision read method.

The diagrams of FIGS. 7B and 9 differ from the diagrams of FIGS. 7A and 8 in terms of the read resolution applied in the soft decision read operation. The difference in the read resolution may correspond to the difference in the number of bits of reliability data generated in the soft decision read operation.

FIGS. 7B and 9 omit the illustration of an operation of reading/outputting the LSB of reliability data, and the other configurations are substantially identical to those of FIGS. 7A and 8. For example, the read resolution information 3Bh used to determine the number of bits of reliability data, and the command 4Ah for outputting the last reliability data are different between FIGS. 8 and 9, which accounts for the difference in terms of the read resolution. However, the configurations of the other commands illustrated in FIG. 9, and the data read/output operations according to each command are the same as those of FIG. 8. Thus, a description of the same configurations will be omitted for conciseness.

In FIGS. 8 and 9, the hard decision data, the MSB of the reliability data, and the LSB of the reliability data, which are sequentially provided from the flash memory device 100 to the ECC 230, may be used in step-by-step error correction operations by the ECC 230. The results of the step-by-step error correction operations may be used to determine whether to use the next bit of the reliability data for error correction. For example, if the error is correctable by the error correction operation based on the MSB of the reliability data, the error correction operation is completed and an operation of outputting the soft decision data following the MSB of the reliability data and an error correction operation using the same are omitted. To this end, after completion of error correction, the memory controller 200 of the inventive concepts does not generate the soft decision output command for outputting the next soft decision data. Consequently, after completion of error correction by the ECC 230, the operation of outputting the soft decision data from the flash memory device 100 can be omitted or interrupted. Accordingly, the overhead of the read/output operation on the data used for error correction can be reduced, and the reliability of the data read from the flash memory device 100 can be improved.

It has been illustrated that the resolution of the soft decision read operation is 2 or 3. However, this is merely an example of the inventive concepts. The read resolution applicable to the soft decision read operation is not limited to a specific embodiment but may vary according to various embodiments. Also, the number of bits of the reliability data included in the soft decision data may also vary according to a variation in the read resolution of the soft decision read operation.

Figure 10A:
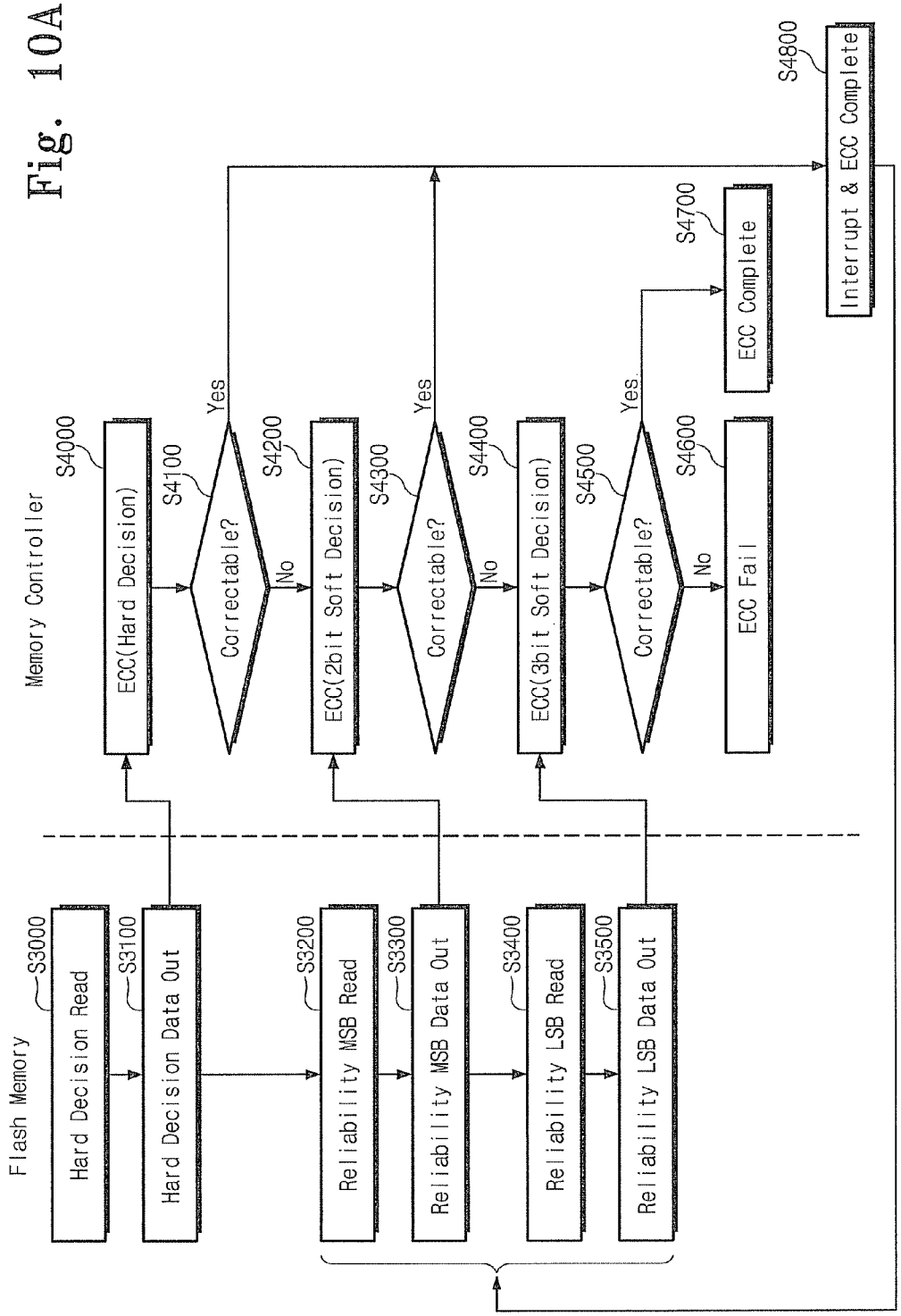
FIGS. 10A and 10B are flow diagrams illustrating soft decision read methods and error correction methods using the same according to a second example embodiment of the inventive concepts.
Figure 10B:
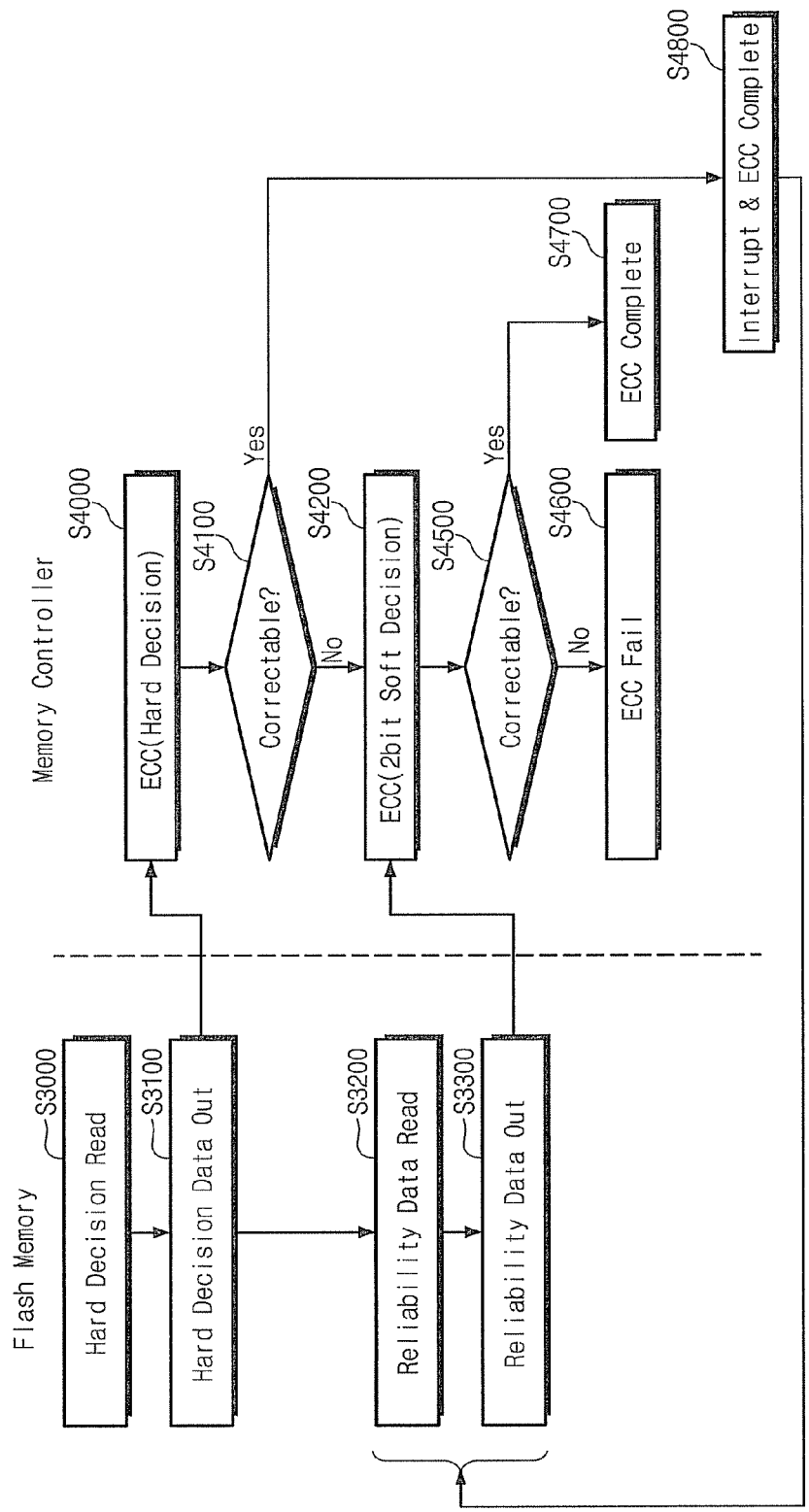

FIGS. 10A and 10B are flow diagrams illustrating soft decision read methods and error correction methods using the same according to a second example embodiment of the inventive concepts. FIG. 10A illustrates a 3-bit soft decision read method, and FIG. 10B illustrates a 2-bit soft decision read method.

The soft decision read methods of FIGS. 10A and 10B differ from the soft decision read methods of FIGS. 7A and 7B in terms of the read times of the hard decision data, the MSB of the reliability data and the LSB of the reliability data in the soft decision read operation. However, the soft decision read method of FIGS. 10A and 10B can be implemented by applying the timing diagrams of FIGS. 8 and 9 even without constructing an additional command sequence.

Referring to FIGS. 8 and 10A, the flash memory device 100 reads hard decision data from the memory cells of the corresponding page in response to the soft decision read command 00h, the address Addr and the read resolution information 3Ch generated by the memory controller 200 (S3000). In this case, the operations of reading the MSB and the LSB of the reliability data may be scheduled in suitable timing under the control of the control logic 150 (refer to S3200 and S3400).

The flash memory device 100 transmits the hard decision data to the ECC 230 in response to the soft decision output command 41h generated by the memory controller 200 (S3100). In an example embodiment, after the hard decision data are transmitted to the ECC 230, the flash memory device 100 may continue to read the MSB of the reliability data even when an additional soft decision data read command is not inputted (S3200). The operation of reading the MSB of the reliability data corresponds to the scheduling operation performed by the control logic 150 in response to the soft decision read command 00h, the address Addr and the read resolution information 3Ch provided to the flash memory device 100 in S3000.

The ECC 230 receives the hard decision data from the flash memory device 100 to perform an error correction operation based on the hard decision data (S4000). Thereafter, the ECC 230 determines whether an error in the read data is correctable by the error correction operation of S4000 (i.e., the error correction operation based on the hard decision data) (S4100). If it is determined that the error is correctable by the error correction operation based on the hard decision data (for example, if there are less than 60 errors per sector) (S4100), the error correction operation is completed without performing the operation of reading/outputting the other soft decision data (i.e., the MSB of the reliability data and the LSB of the reliability data) (S4800). If it is determined that the error is not correctable by the error correction operation based on the hard decision data (for example, if there are more than 60 errors per sector) (S4100), the second soft decision output command 41h for outputting the MSB of the reliability data is provided to the flash memory device 100.

The flash memory device 100 transmits the MSB of the reliability data to the ECC 230 in response to the second soft decision output command 41h generated by the memory controller 200 (S3300). In an example embodiment, after the MSB of the reliability data is transmitted to the ECC 230, the flash memory device 100 may continue to read the LSB of the reliability data even when an additional soft decision data read command is not inputted (S3400). The operation of reading the LSB of the reliability data corresponds to the scheduling operation performed by the control logic 150 in response to the soft decision read command 00h, the address Addr and the read resolution information 3Ch provided to the flash memory device 100 in S3000.

The ECC 230 performs an error correction operation by using the hard decision data provided in S3100 and the MSB of the reliability data provided in S3300 (S4200). The MSB of the reliability data outputted in S3300 corresponds to the reliability data outputted in the 2-bit soft decision read operation. Thus, the error correction operation of S4200 is substantially identical to the error correction operation based on the reliability data outputted in the 2-bit soft decision read operation. That is, the inventive concepts can perform an error correction operation with a higher accuracy by selectively providing only the MSB of the reliability data among the data obtained in a soft decision read operation with a read resolution of 3 to the ECC 230 without performing a soft decision read operation with a read resolution of 2.

Thereafter, the ECC 230 determines whether an error in the read data is correctable by the error correction operation of S4200 (i.e., the error correction operation based on the MSB of the reliability data) (S4300). If it is determined that the error is correctable by the error correction operation based on the MSB of the reliability data (for example, if there are less than 80 errors per sector) (S4300), the error correction operation is completed without performing the operation of reading/outputting the other soft decision data (i.e., the LSB of the reliability data) (S4800). If it is determined that the error is not correctable by the error correction operation based on the MSB of the reliability data (for example, if there are more than 80 errors per sector) (S4300), the third soft decision output command 4Bh for outputting the last soft decision data (i.e., the LSB of the reliability data) is provided to the flash memory device 100.

The flash memory device 100 transmits the LSB of the reliability data to the ECC 230 in response to the third soft decision output command 4Bh generated by the memory controller 2000 (S3500). The ECC 230 performs an error correction operation by using the hard decision data provided in S3100, the MSB of the reliability data provided in S3300, and the LSB of the reliability data provided in S3500 (S4400). The LSB of the reliability data outputted in S3500 is a subdivision of the reliability data outputted in the 2-bit soft decision read operation as illustrated in FIGS. 6A to 6E, which corresponds to the reliability data that can be obtained only in the 3-bit soft decision read operation. Thus, the error correction operation of S4400 is substantially identical to the error correction operation based on the reliability data outputted in the 3-bit soft decision read operation.

Thereafter, the ECC 230 determines whether an error in the read data is correctable by the error correction operation of S4400 (i.e., the error correction operation based on the LSB of the reliability data) (S4500). If it is determined that the error is correctable by the error correction operation based on the LSB of the reliability data (for example, if there are less than 110 errors per sector) (S4500), the error correction operation is completed (S4700). If it is determined that the error is not correctable by the error correction operation based on the LSB of the reliability data (for example, if there are more than 110 errors per sector) (S4500), the error correction operation is determined as fail (S4600).

FIGS. 10B and 9 illustrate a 2-bit soft decision read method and a command sequence corresponding thereto. The diagrams of FIGS. 10B and 9 differ from the diagrams of FIGS. 10A and 8 in terms of the read resolution applied in a soft decision read operation. FIGS. 10B and 9 omit the illustration of the operation of reading/outputting the LSB of reliability data. The other configurations are identical to those of FIGS. 10A and 8. Thus, a description of the same configurations will be omitted for conciseness.

Figure 11A:
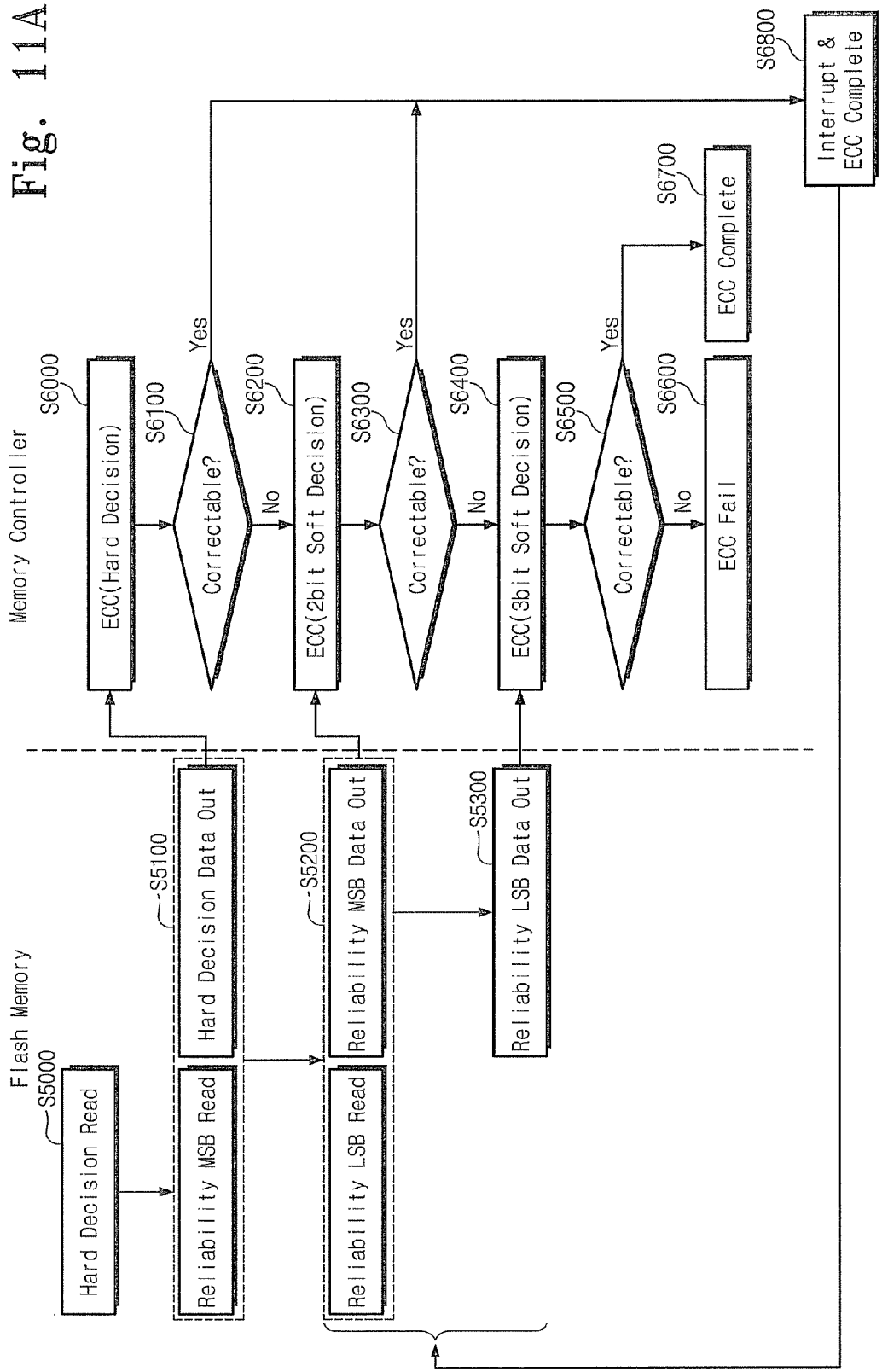
FIGS. 11A, 11B and 12 are diagrams illustrating soft decision read methods and error correction methods using the same according to a third example embodiment of the inventive concepts.
Figure 11B:
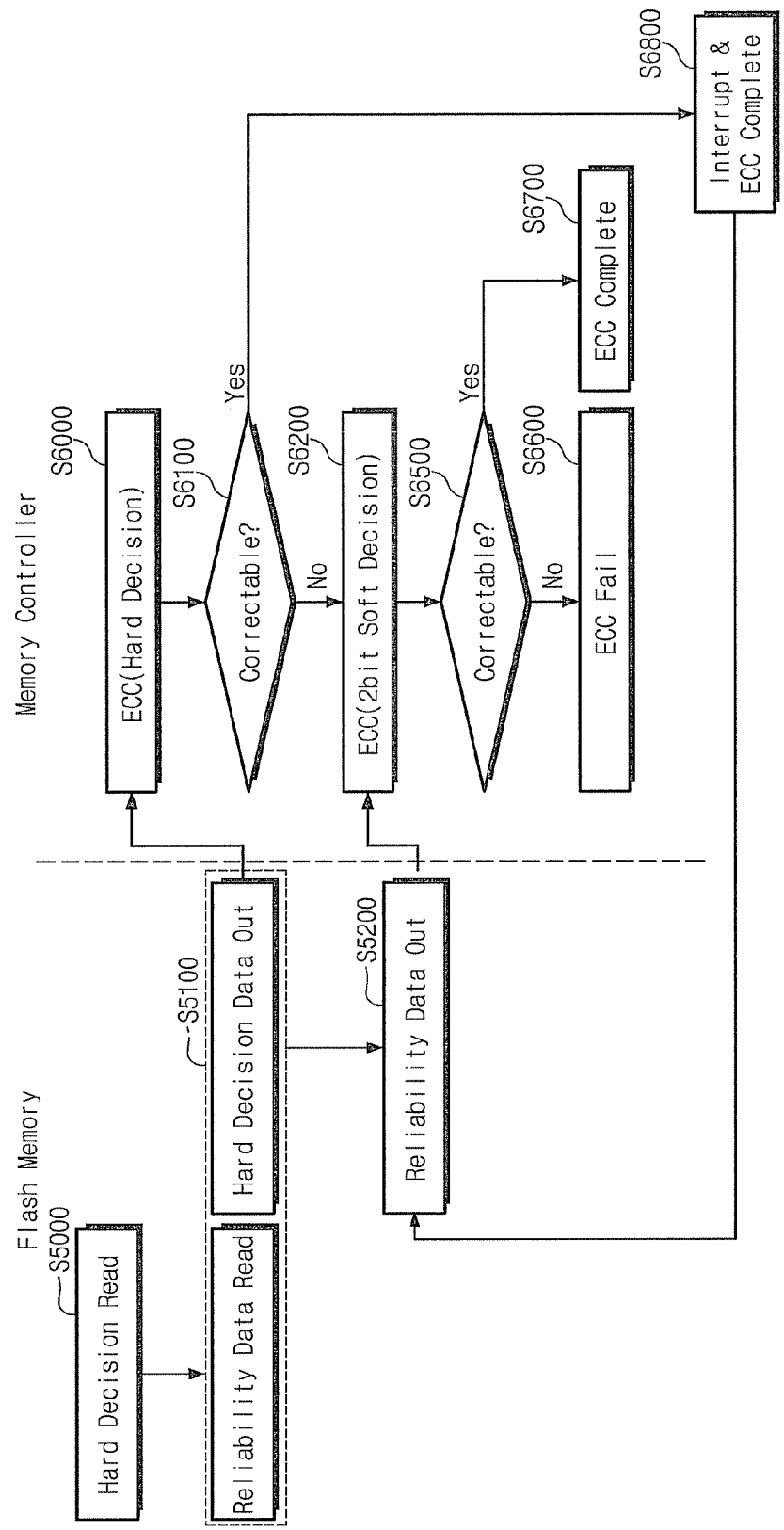
Figure 12:
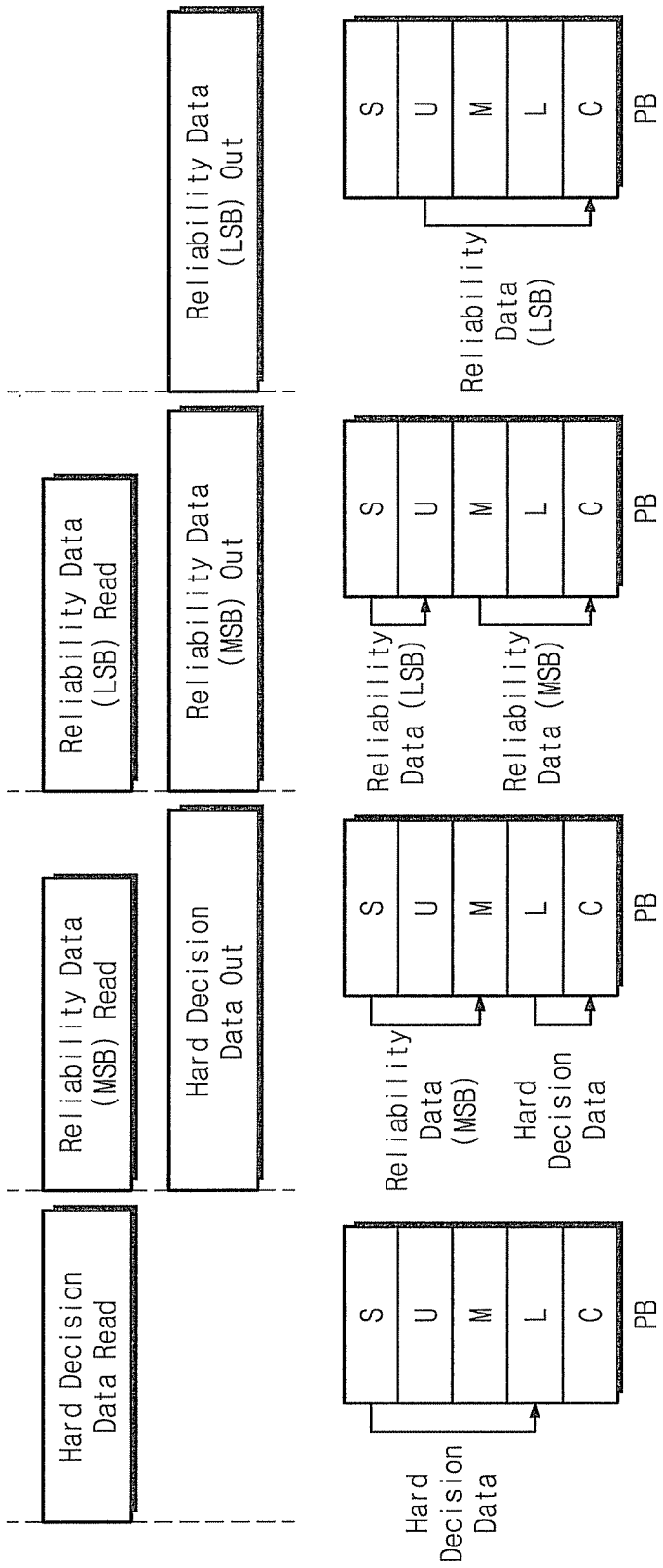

FIGS. 11A, 11B and 12 are diagrams illustrating soft decision read methods and error correction methods using the same according to a third example embodiment of the inventive concepts. FIGS. 11A and 12 illustrate a 3-bit soft decision read method, and FIG. 11B illustrates a 2-bit soft decision read method.

Referring to FIGS. 11A and 12, the flash memory device 100 reads hard decision data from the memory cells of the corresponding page in response to the soft decision read command 00h, the address Addr and the read resolution information 3Ch generated by the memory controller 200 (S5000). Thereafter, in response to the first soft decision output command 41h generated by the memory controller 200, the flash memory device 100 outputs the hard decision data to the ECC 230 and reads the MSB of the reliability data (S5100). That is, the operation of outputting the hard decision data and the operation of reading the MSB of the reliability data are performed simultaneously (or in parallel). The operation of reading the hard decision data and the operation of reading the MSB of the reliability data may be scheduled in suitable timing under the control of the control logic 150 in response to the soft decision read command 00h, the address Addr and the read resolution information 3Ch generated by the memory controller 200 in order to perform a soft decision read operation. The soft decision read operation according to the inventive concepts may include one soft decision read command and one or more soft decision output commands. Each of the soft decision output commands may be generated separately with respect to each bit (e.g., MSB and LSB) of the reliability data and the hard decision data.

As illustrated in FIG. 12, each page buffer PB corresponding to each bit line (pair) may include a plurality of latches S, U, M, L and C. The latch S is a sensing latch that reads/latches data from the corresponding bit line (pair). The latch C is a cache latch that temporarily stores data received from an external device and data outputted from the page buffer PB to an external device. The latch U, the latch M and the latch L are respectively an upper latch, a medium latch and a lower latch, which may latch the data received from the sensing latch S or the latch to be provided to the cache latch C. For example, the data latched in the sensing latch S may be dumped to one of the upper latch U, the medium latch M and the lower latch L. The data stored in the upper latch U, the medium latch M and the lower latch L may be output to an external device after being temporarily stored in the cache latch C. This configuration of the latches is merely an example of the inventive concepts. The number of latches in each page buffer PB is not limited to a specific embodiment but may vary according to various embodiments.

In an example embodiment, the hard decision data may be latched in the lower latch L after being read through the sensing latch S in S5000. The hard decision data latched in the lower latch L are transferred to the cache latch C in S5100 prior to output to the ECC 230. Concurrently, the MSB of the reliability data may be latched in the medium latch M after being read through the sensing latch S.

The ECC 230 receives the hard decision data from the flash memory device 100 to perform an error correction operation based on the hard decision data (S6000). Thereafter, the ECC 230 determines whether an error in the read data is correctable by the error correction operation of S6000 (i.e., the error correction operation based on the hard decision data) (S6100).

If it is determined that the error is correctable by the error correction operation based on the hard decision data (for example, if there are less than 60 errors per sector) (S6100), the error correction operation is completed is completed without performing the operation of reading/outputting the other soft decision data (i.e., outputting the MSB of the reliability data and reading and outputting the LSB of the reliability data) (S6800). If it is determined that the error is not correctable by the error correction operation based on the hard decision data (for example, if there are more than 60 errors per sector) (S6100), the second soft decision output command 41h is provided to the flash memory device 100. In response to the second soft decision output command 41h, the flash memory device 100 outputs the MSB of the reliability data read in S5100 to the ECC 230 and reads the LSB of the reliability data (S5200). That is, the operation of outputting the MSB of the reliability data and the operation of reading the LSB of the reliability data are performed simultaneously (or in parallel). The operation of reading the LSB of the reliability data may be scheduled in suitable timing under the control of the control logic 150 in response to the soft decision read command 00h, the address Addr and the read resolution information 3Ch.

Herein, the MSB of the reliability data latched in the medium data M is transferred to the cache latch C prior to output, and the LSB of the reliability data is latched in the upper latch U after being read through the sensing latch S.

The ECC 230 performs an error correction operation by using the hard decision data provided in S5100 and the MSB of the reliability data provided in S5200 (S6200). The error correction operation based on the MSB of the reliability data is substantially identical to the error correction operation based on the reliability data outputted in the 2-bit soft decision read operation. That is, the inventive concepts can perform an error correction operation with a higher accuracy by selectively providing only the MSB of the reliability data among the data obtained in a soft decision read operation with a read resolution of 3 to the ECC 230 without performing a soft decision read operation with a read resolution of 2.

Thereafter, the ECC 230 determines whether an error in the read data is correctable by the error correction operation of S6200 (i.e., the error correction operation based on the MSB of the reliability data) (S6300). If it is determined that the error is correctable by the error correction operation based on the MSB of the reliability data (for example, if there are less than 80 errors per sector) (S6300), the error correction operation is completed without performing the operation of outputting the other soft decision data (i.e., the LSB of the reliability data) (S6800). If it is determined that the error is not correctable by the error correction operation based on the MSB of the reliability data (for example, if there are more than 80 errors per sector) (S6300), the third soft decision output command (41h or 4Bh in FIG. 13) for outputting the last soft decision data is provided to the flash memory device 100. Herein, the LSB of the reliability data latched in the upper latch U is transferred to the cache latch C prior to output.

The flash memory device 100 outputs the LSB of the reliability data to the ECC 230 in response to the third soft decision output command (41h or 4Bh in FIG. 13) (S5300). The ECC 230 performs an error correction operation by using the hard decision data provided in S5100, the MSB of the reliability data provided in S5200 and the LSB of the reliability data provided in S5300 (S6400). The LSB of the reliability data outputted in S5300 is a subdivision of the reliability data outputted in the 2-bit soft decision read operation, which corresponds to the reliability data that can be obtained only in the 3-bit soft decision read operation. Thus, the error correction operation of S6400 is substantially identical to the error correction operation based on the reliability data outputted in the 3-bit soft decision read operation.

Thereafter, the ECC 230 determines whether an error in the read data is correctable by the error correction operation of S6400 (i.e., the error correction operation based on the LSB of the reliability data) (S6500). If it is determined that the error is correctable by the error correction operation based on the LSB of the reliability data (for example, if there are less than 110 errors per sector) (S6500), the error correction operation is completed (S6700). If it is determined that the error is not correctable by the error correction operation based on the LSB of the reliability data (for example, if there are more than 110 errors per sector) (S6500), the error correction operation is determined as fail (S6600).

FIG. 11B illustrates a 2-bit soft decision read method. The diagram of FIG. 11B differs from the diagram of FIG. 11A in terms of the read resolution applied in a soft decision read operation. FIG. 11B omits the illustration of the operation of reading/outputting the LSB of reliability data. The other configurations are substantially identical to those of FIG. 11A. Thus, a description of the same configurations will be omitted for conciseness.

Figure 13:
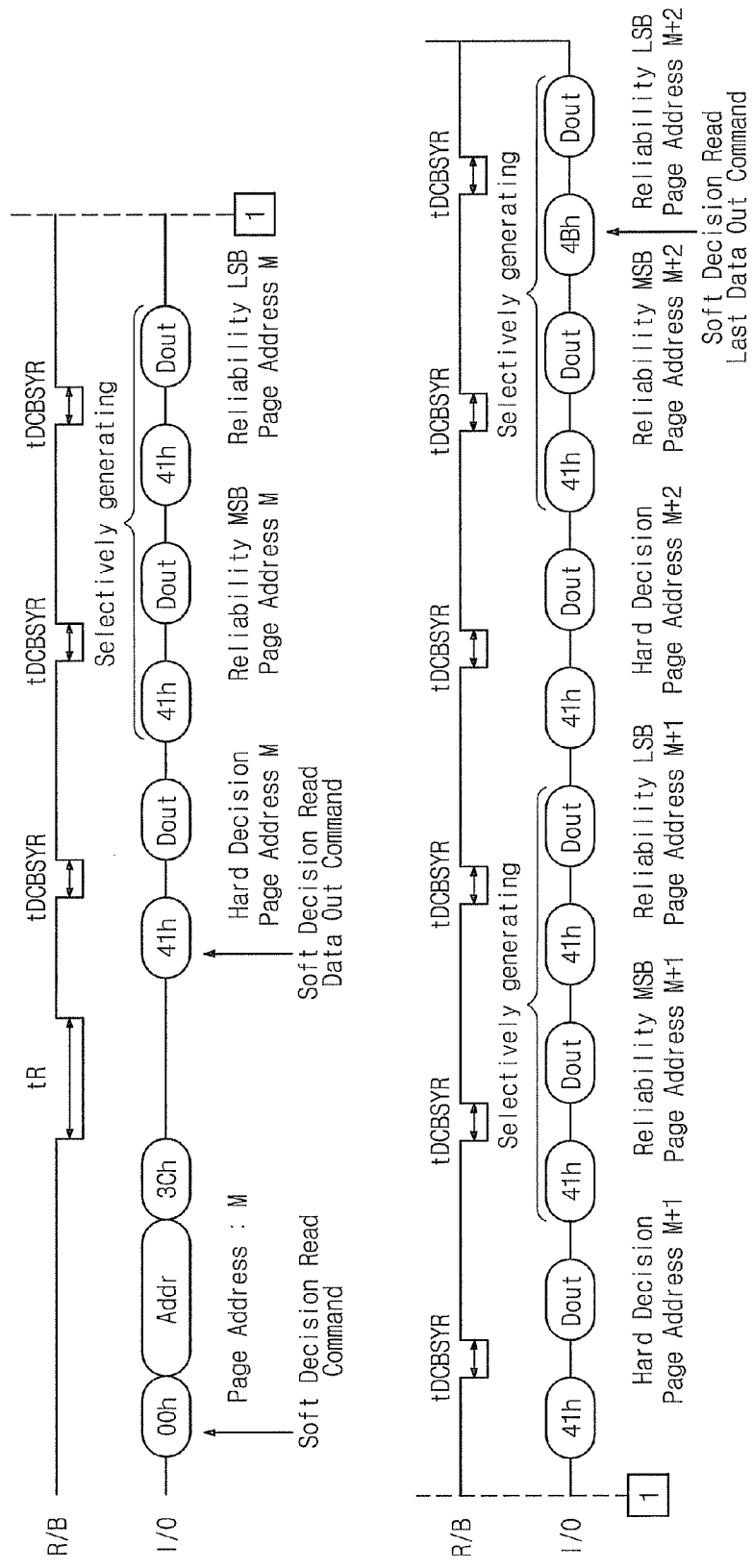
FIG. 13 is a timing diagram illustrating a command sequence of a cache read mode corresponding to a 3-bit soft decision read method illustrated in FIG. 11A.
Figure 14:
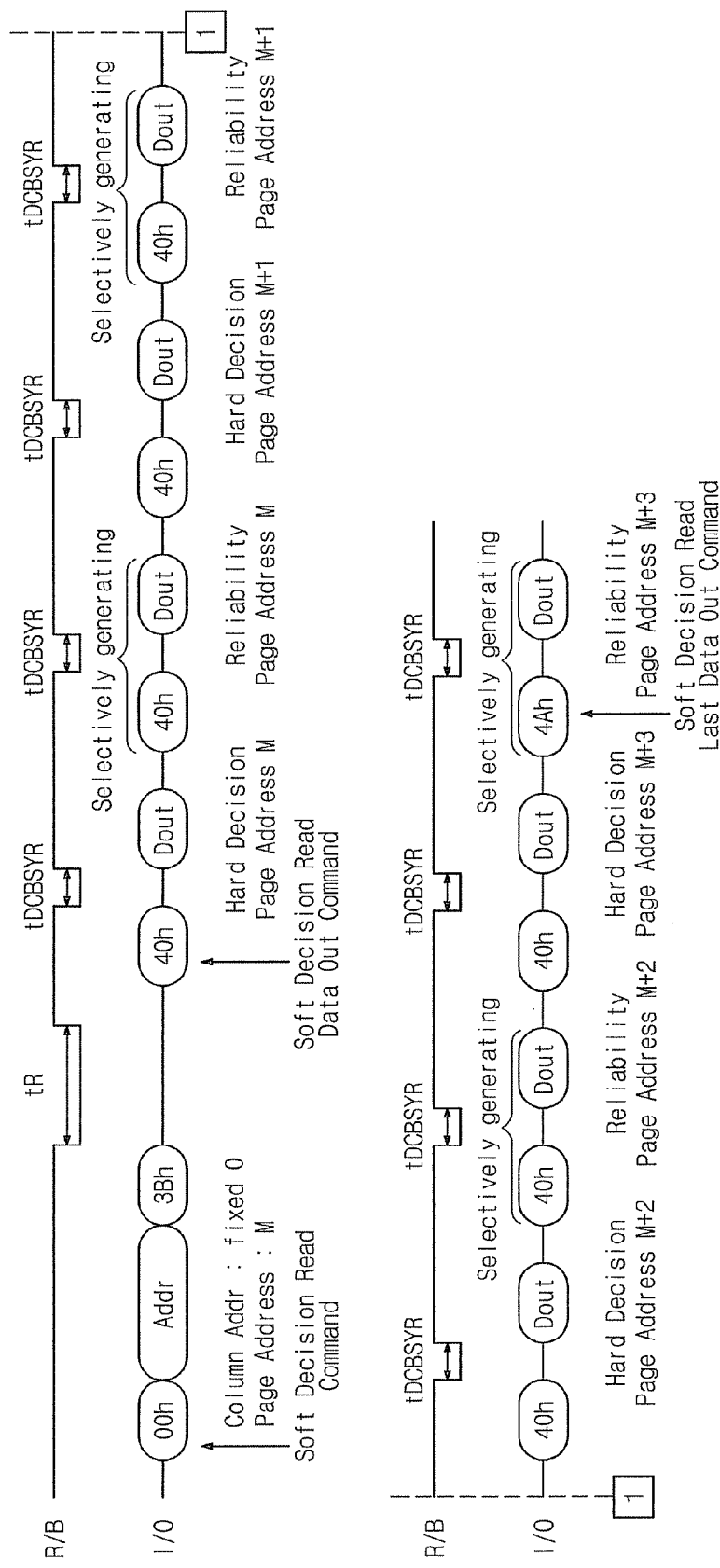
FIG. 14 is a timing diagram illustrating a command sequence of a cache read mode corresponding to a 2-bit soft decision read method illustrated in FIG. 11B.

FIG. 13 is a timing diagram illustrating a command sequence of a cache read mode corresponding to the 3-bit soft decision read method of FIG. 11A, and FIG. 14 is a timing diagram illustrating a command sequence of a cache read mode corresponding to the 2-bit soft decision read method of FIG. 11B.

Referring to FIGS. 13 and 14, if a soft decision read operation is performed in a pipeline manner, the basic configuration of the soft decision read command including the soft decision read command 00h and the read resolution information 3Ch and 3Bh are the same as those illustrated in FIGS. 8 and 9. Also, the configuration for determining the number of bits of the reliability data by using the read resolution information of the soft decision read command is the same as that illustrated in FIGS. 8 and 9.

The timing diagram of FIG. 13 differs from the timing diagram of FIG. 14 in terms of the read resolution applied in the soft decision read operation. The difference in the read resolution may correspond to the difference in the number of bits of reliability data generated in the soft decision read operation. This means that there are differences between FIGS. 13 and 14 in terms of the read resolution information 3Ch and 3Bh used to determine the number of bits of the reliability data and the commands 4Bh and 40h for outputting the last reliability data. However, the configurations of the other commands and the data read/output operations according to each command are the same between FIGS. 13 and 14. Thus, the timing diagram corresponding to the 3-bit soft decision read method of FIG. 13 is exemplified to describe a soft decision read operation based on a cache read scheme. Thus, a description of an overlap between FIGS. 13 and 14 will be omitted for conciseness.

Referring to FIGS. 11A and 13, the flash memory device 100 reads hard decision data from the memory cells of the corresponding page in response to the soft decision read commands 00h, the address Addr and the read resolution information 3Ch generated by the memory controller 200. Thereafter, whenever each of the soft decision output commands 41h is generated by the memory controller 200, the flash memory device 100 may simultaneously perform an operation of outputting the previous read data (e.g., the hard decision data) to the ECC 230 and an operation of reading the next soft decision data (e.g., the MSB of the reliability data). Consequently, in the soft decision read operation, the operation of reading data and the operation of outputting the read data can be performed in a pipeline manner.

Herein, if the read resolution information is set to represent the number of bits of the reliability data corresponding to a plurality of pages, the operation of outputting the last soft decision data of the $M^{th}$ page and the operation of reading the hard decision data of the $(M+1)^{th}$ page can be simultaneously performed.

Herein, the number of bits of the reliability data set by the read resolution information is not limited to the number of bits of the reliability data corresponding to a specific page but may vary according to various embodiments.

In FIGS. 13 and 14, the hard decision data, the MSB of the reliability data, and the LSB of the reliability data, which are sequentially provided from the flash memory device 100 to the ECC 230 in a pipeline manner, may be used in step-by-step error correction operations by the ECC 230. The results of the step-by-step error correction operations may be used to determine whether to use the next reliability data bit for error correction. For example, if the error is corrected by the MSB of the reliability data, the error correction operation is completed and an operation of outputting the soft decision data on the bit following the MSB of the reliability data and an error correction operation using the same are omitted or interrupted. To this end, the memory controller 200 does not generate the soft decision output command or generates an interrupt signal Intr so that the data bit following the soft decision data bit used in the current error correction operation is not output from the flash memory device 100 to the ECC 230. Consequently, after completion of error correction by the ECC 230, the operation of outputting the soft decision data from the flash memory device 100 can be omitted or interrupted. Accordingly, the overhead of the read/output operation on the data used for error correction can be reduced, and the reliability of the data read from the flash memory device 100 can be improved.

Figure 15:
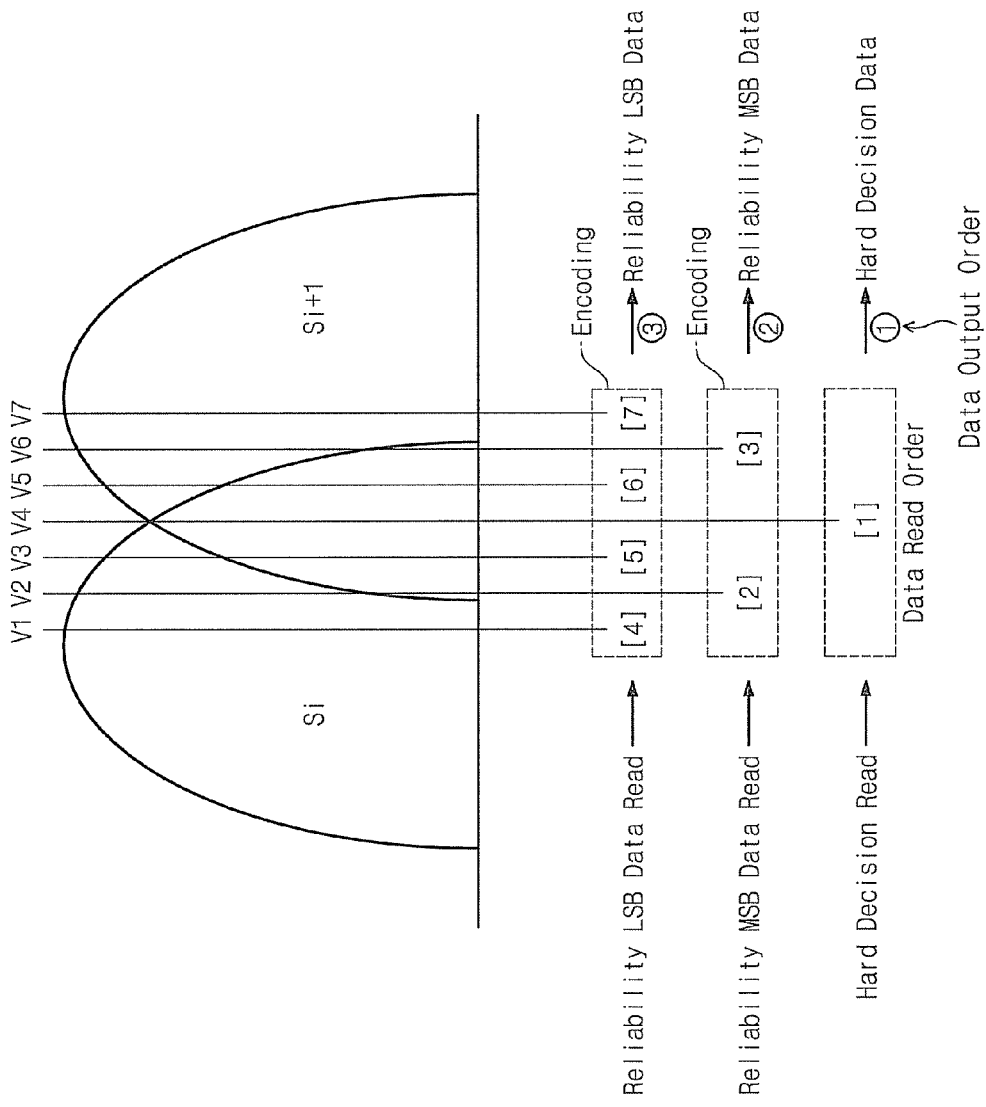
FIGS. 15 to 17 are diagrams illustrating examples of a data output sequence and a read sequence of a page buffer in a read operation according to an example embodiment of the inventive concepts.
Figure 16:
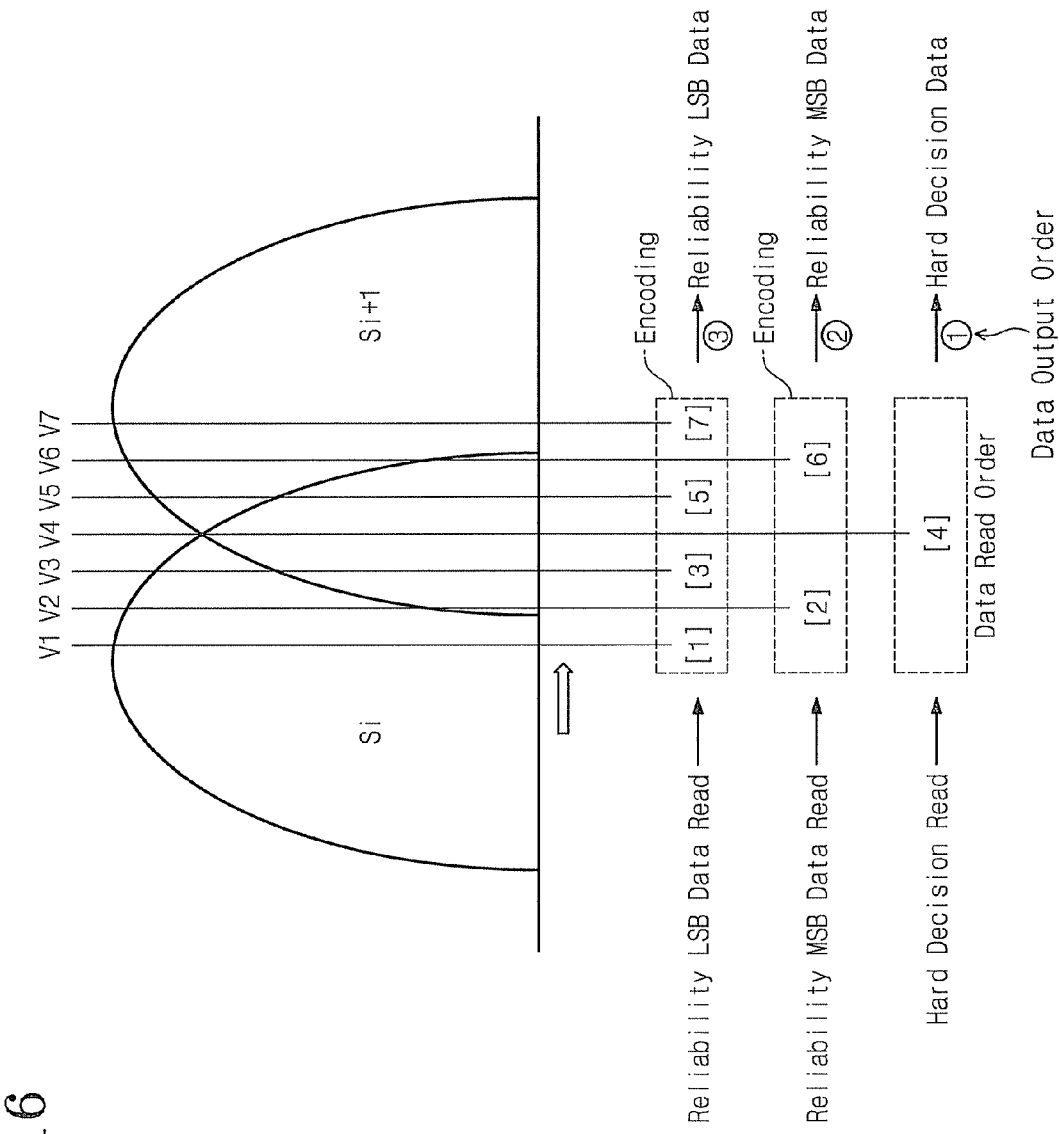
Figure 17:
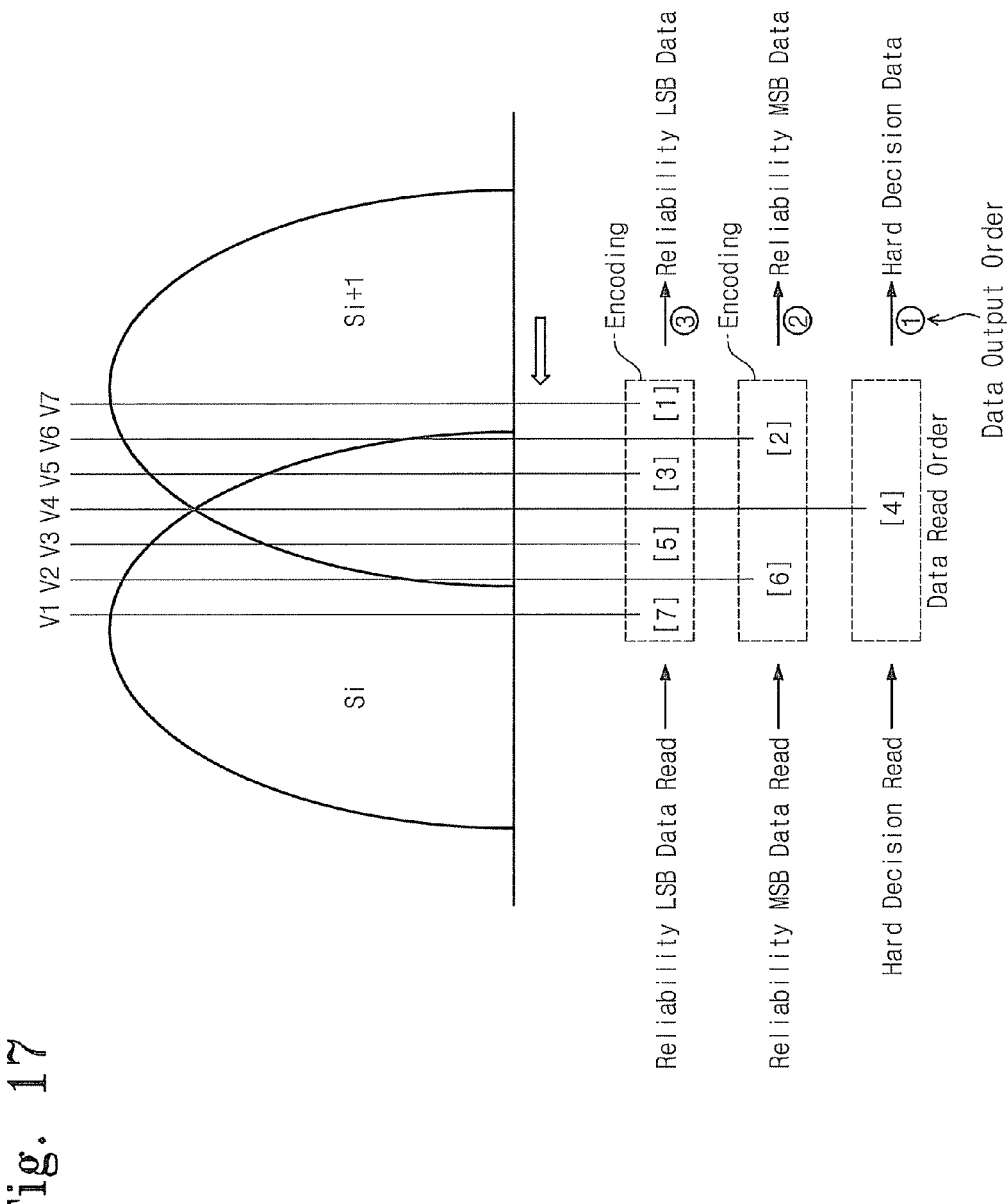

FIGS. 15 to 17 are diagrams examples of a data output sequence and a read sequence of a page buffer in a read operation according to an example embodiment of the inventive concepts. In FIGS. 15 to 17, a numeral in [ ] represents the number of each of the 7 read operations included in the soft decision read operation. Also, a numeral in O represents the output sequence of the data obtained through the soft decision read operation.

If the flash memory device 100 performs a 3-bit soft decision read operation, a read operation may be performed seven times and 1-bit hard decision data and 2-bit reliability data may be latched in each page buffer PB. In an example embodiment, the 2-bit reliability data may be encoded by the page buffer PB.

Referring to FIG. 15, the flash memory device 100 may determine the read sequence according to the output data sequence. For example, the flash memory device 100 may first read the hard decision data and then read the MSB of the reliability data and the LSB of the reliability data sequentially.

In an example embodiment, the hard decision data may be first read by applying a V4 voltage (see [1]). The first read hard decision data may be first output to the ECC 230 in response to the first soft decision output command provided from the memory controller 200 (see ①).

The hard decision data provided to the ECC 230 may be used in the first-step error correction operation among the step-by-step error correction operations. As a result of the first-step error correction operation, if the error is correctable by the hard decision data, the error correction operation is completed and the operation of reading/outputting the MSB and LSB of the reliability data is omitted. If the error is not correctable by the hard decision data, the memory controller 200 generates the soft decision output command to the flash memory device 100 to control the flash memory device 100 to output the MSB of the reliability data.

The reliability data MSB may be generated as the encoding result of two data (i.e., the second read data and the third read data) by applying a V2 voltage and a V6 voltage (see [2] and [3]). The encoded reliability data MSB may be second outputted to the ECC 230 in response to the second soft decision output command provided from the memory controller 200 (see ②). The reliability data MSB provided to the ECC 230 may be used in the second-step error correction operation among the step-by-step error correction operations. As a result of the second-step error correction operation, if the error is correctable by the reliability data MSB, the error correction operation is completed and the operation of reading/outputting the reliability data MSB is omitted. If the error is not correctable by the reliability data MSB, the memory controller 200 generates the third soft decision output command to the flash memory device 100 to control the flash memory device 100 to output the reliability data LSB.

The reliability data MSB may be generated as the encoding result of four data (i.e., the fourth to seventh read data) by applying V1, V3, V5 and V7 voltages (see [4] to [7]). The encoded reliability data LSB may be third outputted to the ECC 230 in response to the third soft decision output command provided from the memory controller 200 (see ③). The reliability data LSB provided to the ECC 230 may be used in the third-step error correction operation among the step-by-step error correction operations. As a result of the third-step error correction operation, if the error is not correctable by the reliability data LSB, the memory controller 200 determines that the error correction operation failed. If the error is correctable by the reliability data LSB, the error correction operation is completed.

FIGS. 16 and 17 are diagrams a data output sequence and a read sequence in a soft decision read operation of a flash memory device 100 according to another example embodiment of the inventive concepts.

Referring to FIGS. 16 and 17, in a soft decision read operation, the flash memory device 100 may perform a plurality of read operations by sequentially applying variable voltages V1~V7 with sequentially increased or decreased levels (see [1]~[7] of FIG. 6 and [7]~[1] of FIG. 7). The sequentially read data may be latched in a plurality of latches provided in the page buffer PB. For example, after the flash memory device 100 reads the fourth data by sequentially applying the voltages with sequentially increased or decreased levels (see [4]), the first data may be outputted to the ECC 230 (see ①). After the sixth data (see [6]) in FIG. 16 or the second data (see [2]) in FIG. 17 are read, the flash memory device 100 encodes the second read data (see [2]) and the sixth read data (see [6]] to output the MSB of the reliability data (see ②). After the seventh data (see [7]) in FIG. 16 or the first data (see [1]) in FIG. 17 are read, the flash memory device 100 encodes the first, third and fifth read data (see [1], [3] and [5]) and the seventh read data (see [7]] to output the LSB of the reliability data (see ③).

According to the above configuration, the data output sequence and the read operation sequence in the page buffer PB in the soft decision read operation are not consistent with each other. However, because the variable read voltages are sequentially generated, the word line voltage generation efficiency of the flash memory device 100 can be improved. Meanwhile, the data output operation and the read operation in the page buffer PB may be performed independently of each other, or may be performed in parallel by a pipeline scheme such as a cache read mode. Also, the output sequence and the read sequence of the page buffer PB in the FIGS. 15 to 17 are not limited to a specific embodiment but may vary according to various embodiments.

Figure 18:
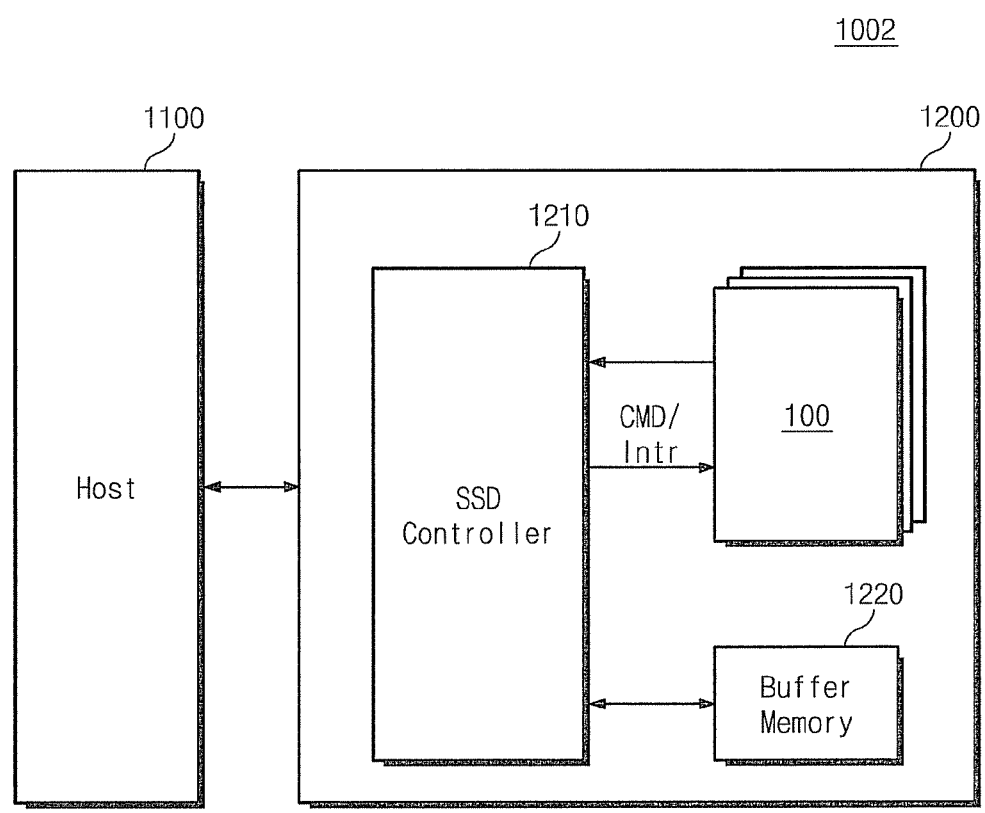
FIG. 18 is a block diagram illustrating a structure of a data storage system including a flash memory device according to an example embodiment of the inventive concepts.

FIG. 18 is a block diagram illustrating a structure of a data storage system 1002 including a flash memory device 100 according to an example embodiment of the inventive concepts. In FIG. 18, a solid state disk (SSD) system 1002 using a semiconductor memory device as a main storage unit is illustrated as the data storage system 1002. However, this is merely an example embodiment, and the data storage system is not limited to an SSD. For example, the data storage system may be integrated into one semiconductor device to constitute a PC card (e.g., PCMCIA (Personal Computer Memory Card International Association)), a compact flash card (CF), a smart media card (e.g., SM and SMC), a memory stick, a multimedia card (e.g., MMC, RS-MMC and MAC-micro), an SD card (e.g., SD, miniSD, microSD, and SDHC), or a universal flash storage (UFS).

Referring to FIG. 18, the SSD system 1002 may include a host 1100 and an SSD 1200. The SSD 1200 may include an SSD controller 1210, a buffer memory 1220, and the flash memory device 100 as described according to any of the above embodiments.

The SSD controller 1210 may provide a physical connection with the host 1100 and the SSD 1200. That is, the SSD controller 1210 may provide an interface with the SSD 1200 according to a bus format of the host 1100. The SSD controller 1210 may decode a command received from the host 1100. According to the decoding results, the SSD controller 1210 may access the flash memory device 100. Examples of the bus format of the host 1100 may include Universal Serial Bus (USB), Small Computer System Interface (SCSI), PCI Express, ATA, Parallel ATA (PATA), Serial ATA (SATA), and Serial Attached SCSI (SAS).

The buffer memory 1220 may be configured using a synchronous DRAM (SRAM) in order to provide sufficient buffering in the SSD 1200. However, this is merely an example of the configuration of the buffer memory 1220. The configuration of the buffer memory 1220 is not limited to a specific embodiment but may vary according to various embodiments.

The buffer memory 1220 may temporarily store write data received from the host 1100 or data read from the flash memory device 100. At the read request of the host 1100, if data in the flash memory device 100 is stored in the buffer memory 1220, the buffer memory 1220 may support a cache function of providing the stored data directly to the host 1100. Typically, the data transmission rate according to the bus format (e.g., SATA or SAS0) of the host 1100 is much higher than the data transmission rate of a memory channel of the SSD 1200. If the interface rate of the host 1100 is much higher than that of the SSD 1200, a large-capacity buffer memory 1220 may be provided to minimize the performance degradation caused by the rate difference.

The flash memory device 100 may be used as a main memory of the SSD 1200. To this end, the flash memory device 100 may be configured using a NAND flash memory with a large storage capacity. However, the type of the flash memory device 100 in the SSD 1200 is not limited to a NAND flash memory. For example, the flash memory device 100 may also be configured using a NOR flash memory, a hybrid flash memory with a hybrid of at least two types of memory cells, or a One-NAND flash memory with a controller embedded in a memory chip. Also, a plurality of channels may be provided in the SSD 1200 and a plurality of flash memories 100 may be connected to the respective channels. Although a NAND flash memory has been exemplified as the main memory, other nonvolatile memories may be used as the main memory. For example, at least one of volatile memories (e.g., DRAMs and SRAMs) and nonvolatile memories (e.g., PRAMs, MRAMs, ReRAMs, and FRAMs) may be used as the main memory.

The flash memory device 100 of FIG. 18 may be configured to have substantially the same configuration as the flash memory device of FIGS. 1 and 2. The flash memory device 100 may perform a plurality of read operations on a memory cell by applying a reference read voltage and a plurality of variable read voltages that vary from the reference read voltage. The read data obtained from the read operations may include a plurality of reliability data and hard decision data. In providing the read data to the error correction circuit 230 to the ECC 230, the flash memory device 100 of the inventive concepts may provide the reliability data without a change or may encode the reliability data into a desired (or, alternative a predetermined) data format (i.e., reliability data) before providing it to the ECC 230. In an example embodiment, the reliability data and the hard decision data provided by the flash memory device 100 may be encoded by the page buffer of the flash memory device 100 even without using an additional circuit such as an encoder. Meanwhile, the reliability data encoding scheme and the number of bits of reliability data according to the inventive concepts are not limited to a specific embodiment but may vary according to various embodiments.

Under the control of the control logic 150, the flash memory device 100 of the inventive concepts may sequentially output the bits (e.g., most significant bits (MSBs) and least significant bits (LSBs)) of reliability data and hard decision data read by a soft decision read operation, to an ECC of the SSD controller 1210. Also, a read/output operation on the bits (e.g., MSBs and LSBs) of reliability data and hard decision data according to the inventive concepts may be performed in parallel by a pipeline scheme such as a cache read mode.

The SSD controller 1210 may perform an error correction operation based on hard decision data and an error correction operation based on the bits of reliability data, in a step-by-step manner, by using the bits of the reliability data and the hard decision data provided from the flash memory device 100. According to the result of the step-by-step error correction operation, the output of the bits of the reliability data from the flash memory device 100 to the ECC 230, and the next error correction operation using the same may be omitted. To this end, according to the result of the step-by-step error correction operation, the memory controller 200 may omit the generation of a soft decision output command CMD provided to the flash memory device 100, and may generate an interrupt signal Intr or a reset signal to the flash memory device 100.

Figure 19:
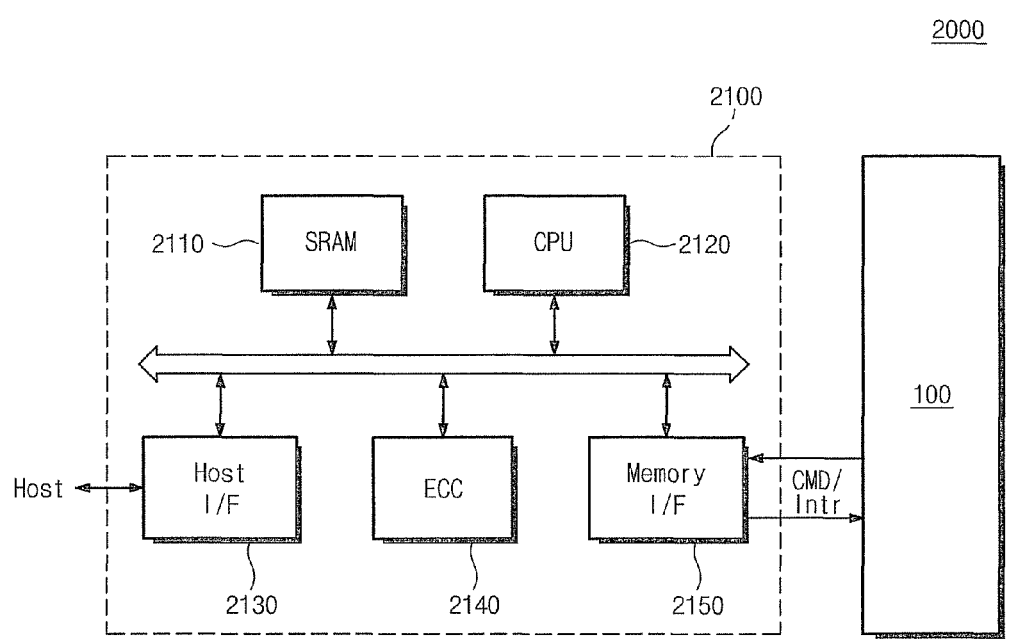
FIG. 19 is a block diagram illustrating a structure of a memory system according to an example embodiment of the inventive concepts.

FIG. 19 is a block diagram illustrating a structure of a memory system 2000 according to an example embodiment of the inventive concepts.

Referring to FIG. 19, the memory system 2000 may include a flash memory device 100 and a memory controller 2100.

The flash memory device 100 of FIG. 19 may be configured to have substantially the same configuration as the flash memory device of FIGS. 1 and 2.

Also, the flash memory device 100 of FIG. 19 may perform a data read/output operation in the same way as the soft decision read operation described above. The memory controller 2100 may be configured to control the flash memory device 100. The memory controller 2100 may be configured to have the same configuration as the memory controller 200 of FIG. 2. Thus, an overlapping description of the same configuration will be omitted for conciseness.

The memory system 2000 may constitute a memory card or a solid state disk (SSD) by the combination of the flash memory device 100 and the memory controller 2100. Examples of the memory card include PC cards (e.g., PCM-CIA (Personal Computer Memory Card International Association)), compact flash cards (CF), smart media cards (e.g., SM and SMC), memory sticks, multimedia cards (e.g., MMC, RS-MMC and MMC-micro), SD cards (e.g., SD, miniSD, microSD, and SDHC), and universal flash storages (UFS).

An SRAM 2110 may be used as a working memory of a central processing unit (CPU) 2120. A host interface (I/F) 2130 may have a data exchange protocol of a host connected to the memory system 2000. An error correction circuit (ECC) 2140 in the memory controller 2100 may be configured to have substantially the same configuration as the ECC 230 of FIG. 2. The ECC 2140 may detect/correct an error in read data by using a plurality of reliability data received from the flash memory device 100. A memory interface (I/F) 2150 may interface with the flash memory device 100. The CPU 2120 may perform an overall control operation for data exchange of the memory controller 2100. Although not illustrated in FIG. 19, the memory system 2000 may further include a read-only memory (ROM) that stores code data for interfacing with the host.

The flash memory device 100 may be provided as a multi-chip package including a plurality of flash memory chips. The memory system 2000 of the inventive concepts may be provided as a high-reliability storage medium with a low error probability. In particular, the flash memory device of the inventive concepts may be provided in a memory system such as a solid state disk (SSD) that is under active research. In this case, the memory controller 2100 may be configured to communication with an external device (e.g., the host) through one of various interface protocols such as USB, MMC, PCI-E, SAS, SATA, PATA, SCSI, ESDI, and IDE. Also, the memory controller 2100 may further include a configuration for performing a random operation.

Figure 20:
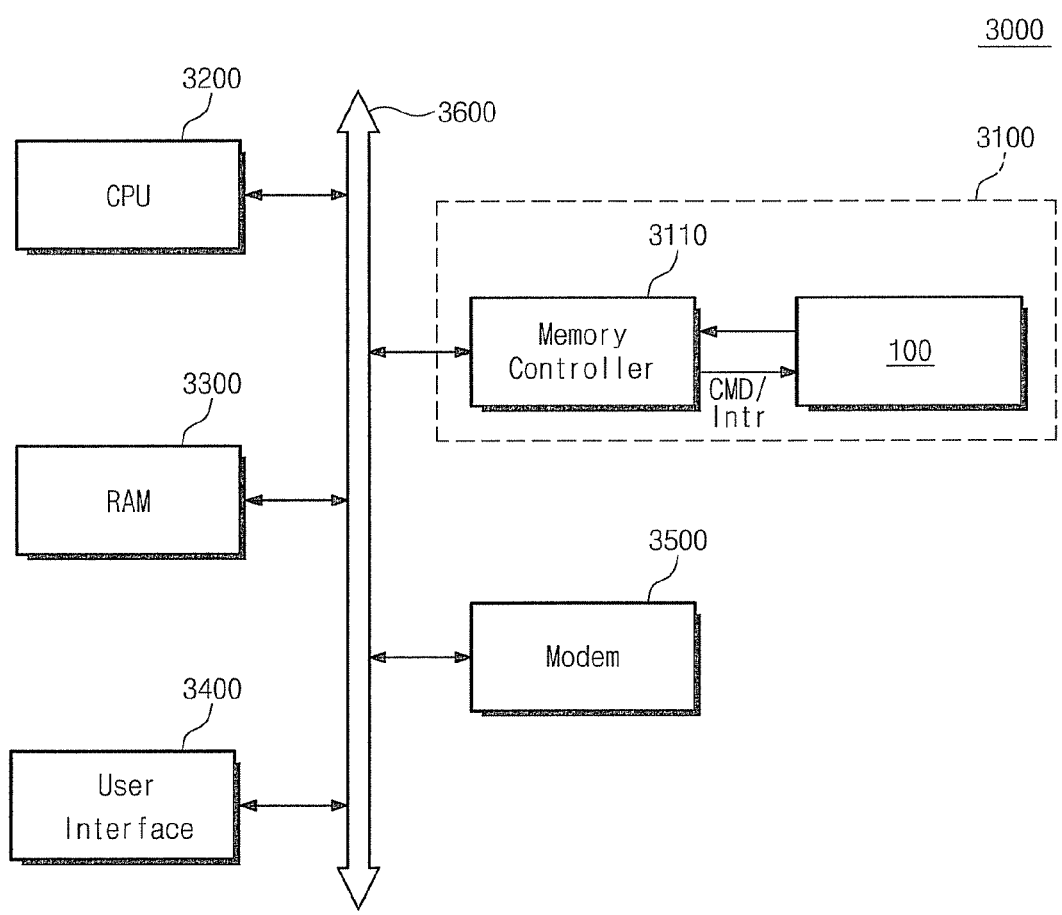
FIG. 20 is a block diagram illustrating a structure of a computing system including a flash memory device according to an example embodiment of the inventive concepts.

FIG. 20 is a block diagram illustrating a structure of a computing system 3000 including a flash memory device 100 according to an example embodiment of the inventive concepts.

Referring to FIG. 20, the computing system 3000 may include a microprocessor (or CPU) 3200, a RAM 3300, a user interface 3400, a modem 3500 (e.g., a baseband chipset), and a memory system 3100 that are electrically connected to a system bus 3600.

The memory system 3100 may include a memory controller 3110 and a flash memory device 100. The memory controller 3110 may provide a physical connection with the CPU 3200 and the flash memory device 100 through the system bus 3600. That is, the memory controller 3110 may provide an interface with the flash memory device 100 according to a bus format of the CPU 3200.

The flash memory device 100 of FIG. 20 may be configured to have substantially the same configuration as the flash memory device of FIGS. 1 and 2. Also, the flash memory device 100 of FIG. 20 may perform a data read/output operation in the same way as the soft decision read operation described above. Thus, an overlapping description of the same configuration will be omitted for conciseness.

If the computing system 3000 is a mobile device, a battery (not illustrated) may be further provided to supply an operation voltage of the computing system 3000. Although not illustrated in FIG. 20, the computing system 3000 may further include an application chipset, a camera image processor (CIS), and a mobile DRAM. For example, the memory system 3100 may constitute a solid state drive/disk (SSD) that uses a nonvolatile memory to store data. For example, the memory system 3100 of FIG. 20 may constitute the SSD 1200 of FIG. 18. In this case, the memory controller 3110 may operate as the SSD controller 1210.

The nonvolatile memory device and/or the memory controller according to the inventive concepts may be mounted in various types of packages. Examples of the packages of the flash memory device and/or the memory controller according to the inventive concepts include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the inventive concepts sequentially provides the bits of reliability data and hard decision data from the flash memory device to the error correction circuit, thus enabling the error correction circuit to perform a step-by-step error correction operation. According to the results of the step-by-step error correction operation, the output of reliability data from the flash memory device to the error correction circuit and the next error correction operation using the same can be omitted. Consequently, the performance loss caused by the error correction operation can be minimized, and the error correction efficiency can be improved.

Also, the inventive concepts perform a read/output operation of the bits of reliability data and hard decision data to be used for error correction, in a pipeline manner. Accordingly, the overhead of a read/output operation on the data to be used for error correction can be reduced, and the reliability of data read from the flash memory device can be improved.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts are to be determined by the broadest permissible interpretation of the following claims and their equivalents, and shall not be restricted or limited by the foregoing detailed description.

What is claimed is:

1. A method for reading memory cells in an array of nonvolatile memory cells, the method comprising:
reading data from a memory cell using a set of hard decision voltages and at least a first set of soft decision voltages based on a single read command.

2. The method of claim 1, wherein the reading reads data from the memory cell using the set of hard decision voltages and at least the first set of soft decision voltages based on the single read command, an address and a resolution indicator, the resolution indicator indicating a number of sets of soft decision voltages.

3. The method of claim 2, wherein if the resolution indicator indicates two sets, the reading reads data from the memory cell using the set of hard decision voltages, the first set of soft decision voltages, and a second set of soft decision voltages.

4. The method of claim 3, wherein a number of soft decision voltages in the second set is greater than in the first set.

5. The method of claim 1, further comprising:
outputting first read results based on the hard decision voltages in response to a first read out command.

6. The method of claim 5, further comprising:
outputting second read results based on the first set of soft decision voltage in response to a second read out command.

7. The method of claim 6, wherein
the reading reads data from the memory cell using the set of hard decision voltages, using the first set of soft decision voltages and using a second set of soft decision voltages in response to the read command; and further including,
outputting third read results based on the second set of soft decision voltages in response to a third read out command.

8. The method of claim 7, wherein
the outputting second read results outputs a single soft bit for each hard bit output in the outputting first read results; and
the outputting third read results outputs a single soft bit for each hard bit output in the outputting first read results.

9. The method of claim 5, wherein the outputting second read results outputs a single soft bit for each hard bit output in the outputting first read results.

10. The method of claim 7, wherein the reading step sequentially performs reading data based on the set of hard decision voltages, the first set of soft decision voltages and the second set of soft decision voltages in response to the read command.

11. The method of claim 1, wherein the reading step sequentially performs reading data based on the set of hard decision voltages and the first set of soft decision voltages in response to the read command.

12. The method of claim 7, wherein the reading step comprises:
reading data from the memory cell using the set of hard decision voltages after receipt of the read command;
reading data from the memory cell using the first set of soft decision voltages after receiving the first read out command; and
reading data from the memory cell using the second set of soft decision voltages after receiving the second read out command.

13. The method of claim 5, wherein the reading step comprises:
reading data from the memory cell using the set of hard decision voltages after receipt of the read command; and
reading data from the memory cell using the first set of soft decision voltages after receiving the first read out command.

14. The method of claim 1, wherein the reading step comprises:
reading data from the memory cell using the set of hard decision voltages after receipt of the read command; and
reading data from the memory cell using the first set of soft decision voltages after outputting data read using the set of hard decision voltages.

15. The method of claim 7, wherein the reading comprises:
reading data based on the first set of soft decision voltages in parallel with the outputting first read results; and
reading data based on the second set of soft decision voltages in parallel with the outputting second read results.

16. The method of claim 5, wherein the reading comprises:
reading data based on the first set of soft decision voltages in parallel with the outputting first read results.

17. The method of claim 1, wherein the memory cells are multi-level memory cells.

18. A method for reading memory cells in an array of non-volatile memory cells, the method comprising:
sending a read command;
sending a first read out command;
receiving first read results in response to the first read out command, the first read results being based on a read operation using a set of hard decision voltages;
first determining if errors in the first read results are correctable;
sending a second read out command without sending an associated read command if the first determining determines errors in the first read results are not correctable; and
receiving second read results in response to the second read out command, the second read results being based on a read operation using a first set of soft decision voltages.

19. The method of claim 18, wherein the second read out command is not sent if the first determining determines that errors in the first read results are correctable.

20. The method of claim 18, further comprising:
sending a read resolution in association with the read command, the read resolution indicating a number of soft read operations to perform in conjunction with a hard read operation, the hard read operation being performed based on the set of hard decision voltages, and each soft read operation being performed based on different set of soft decision voltages.

21. The method of claim 20, wherein if the read resolution indicates two soft read operations, the method further comprises:
second determining if errors in the second read results are correctable;
sending a third read out command without sending an associated read command if the second determining determines errors in the second read results are not correctable; and
receiving third read results in response to the third read command, the third read results being based on a read operation using a second set of soft decision voltages.

22. The method of claim 21, the third read out command is not sent if the second determining determines that errors in the first read results are correctable.

23. The method of claim 21, further comprising:
third determining if errors in the second read results are correctable.

24. The method of claim 18, further comprising:
second determining if errors in the second read results are correctable;
sending a third read out command without sending an associated read command if the second determining determines errors in the second read results are not correctable; and
receiving third read results in response to the third read command, the third read results being based on a read operation using a second set of soft decision voltages.

25. The method of claim 24, the third read out command is not sent if the second determining determines that errors in the first read results are correctable.

26. The method of claim 24, further comprising:
third determining if errors in the second read results are correctable.

27. The method of claim 24, wherein
the receiving second read results receives a single soft bit for each hard bit received in the receiving first read results; and
the receiving third read results receives a single soft bit for each hard bit received in the receiving first read results.

28. The method of claim 18, wherein the receiving second read results receives a single soft bit for each hard bit received in the receiving first read results.

29. The method of claim 18, wherein the memory cells are multi-level memory cells.

30. A non-volatile multi-level memory device, comprising:
an array of non-volatile memory cells;
control logic configured to read data from a memory cell array using a set of hard decision voltages and at least a first set of soft decision voltages based on a single read command.

31. A data storage system, comprising:
the memory device of claim 30; and
a controller configured to supply the read command.

32. An electronic device comprising:
the memory device of claim 30; and
a controller, the controller including an error correction coding unit configured to error correct read results output from the memory device, and the controller including a processor configured to supply the read command.

33. A computing system, comprising:
a processor;
a memory system, the memory system including the memory device of claim 30 and a controller configured to supply the read command; and
a bus communicatively coupling the processor and the memory system.

* * * * *